US009073301B2

(12) United States Patent
Kondo et al.

(10) Patent No.: US 9,073,301 B2
(45) Date of Patent: Jul. 7, 2015

(54) SCREEN PRINTING MACHINE HAVING A SCREEN POSITION ADJUSTING DEVICE

(75) Inventors: Takeshi Kondo, Chiryu (JP); Ritsuo Hirukawa, Okazaki (JP); Yoji Fujita, Okazaki (JP)

(73) Assignee: FUJI MACHINE MFG. CO., LTD., Chiryu-shi (JP)

( * ) Notice: Subject to any disclaimer, the term of this patent is extended or adjusted under 35 U.S.C. 154(b) by 83 days.

(21) Appl. No.: 13/643,554

(22) PCT Filed: Apr. 25, 2011

(86) PCT No.: PCT/JP2011/060070
§ 371 (c)(1),
(2), (4) Date: Nov. 13, 2012

(87) PCT Pub. No.: WO2011/136178
PCT Pub. Date: Nov. 3, 2011

(65) Prior Publication Data
US 2013/0087057 A1   Apr. 11, 2013

(30) Foreign Application Priority Data

Apr. 27, 2010   (JP) .................................. 2010-102298

(51) Int. Cl.
*B41F 15/00* (2006.01)
*B41F 15/08* (2006.01)
(Continued)

(52) U.S. Cl.
CPC .............. *B41F 15/44* (2013.01); *H05K 3/1233* (2013.01); *H05K 3/3484* (2013.01);
(Continued)

(58) Field of Classification Search
CPC ...... B41F 15/34; B41F 15/42; B41F 15/0818; B41F 15/085; B41F 15/36; B41F 15/44; B41F 15/46
USPC ............................ 101/127.1, 123, 127, 128.1
See application file for complete search history.

(56) References Cited

U.S. PATENT DOCUMENTS

| 4,073,232 A | 2/1978 | Brewer |
| 5,452,656 A | 9/1995 | Becher et al. |

(Continued)

FOREIGN PATENT DOCUMENTS

| CN | 1656866 A | 8/2005 |
| CN | 1907706 A | 2/2007 |

(Continued)

OTHER PUBLICATIONS

International Search Report issued in International Patent Application No. PCT/JP2011/060070 dated Jul. 12, 2011.
(Continued)

*Primary Examiner* — Jill Culler
*Assistant Examiner* — Quang X Nguyen
(74) *Attorney, Agent, or Firm* — Oliff PLC

(57) ABSTRACT

A screen printing machine configured to move a squeegee by a squeegee moving device along a mask to print solder on a substrate through a through hole of the mask is improved in size and usability. A squeegee-device main body is fixed to a mask frame receiver for holding a mask frame, and a squeegee slide, a squeegee head, and a squeegee-slide driving device are provided on the main body. A position adjusting device including two front/rear-direction adjusting units, one right/left-direction adjusting unit, and one floating support unit is provided between a main body frame of the screen printing machine and the mask frame receiver and the squeegee-device main body to adjust relative positions of the mask and the substrate by moving the mask frame receiver and the squeegee-device main body together with each other.

5 Claims, 15 Drawing Sheets

(51) Int. Cl.
| | | |
|---|---|---|
| *B41F 15/26* | (2006.01) | |
| *B41F 15/44* | (2006.01) | |
| *H05K 3/12* | (2006.01) | |
| *B41F 35/00* | (2006.01) | |
| *B41F 15/28* | (2006.01) | |
| *B41F 15/36* | (2006.01) | |
| *H05K 3/34* | (2006.01) | |

(52) U.S. Cl.
CPC .......... *B41F 35/005* (2013.01); *B41F 15/0881* (2013.01); *B41F 15/28* (2013.01); *B41F 15/36* (2013.01); *B41P 2235/246* (2013.01); *B41P 2235/26* (2013.01)

(56) References Cited

U.S. PATENT DOCUMENTS

| | | | | |
|---|---|---|---|---|
| 6,058,835 | A * | 5/2000 | Isogai et al. | 101/127.1 |
| 6,202,551 | B1 | 3/2001 | Murakami | |
| 8,196,287 | B2 | 6/2012 | Awata et al. | |
| 2002/0053132 | A1 | 5/2002 | Hamasaki et al. | |
| 2002/0148374 | A1* | 10/2002 | Peckham et al. | 101/425 |
| 2003/0154868 | A1* | 8/2003 | Mcevoy et al. | 101/127.1 |
| 2005/0077143 | A1 | 4/2005 | Hamasaki et al. | |
| 2005/0115060 | A1 | 6/2005 | Kondo | |
| 2009/0277348 | A1 | 11/2009 | Abe et al. | |
| 2010/0126363 | A1 | 5/2010 | Mizuno et al. | |
| 2010/0133064 | A1 | 6/2010 | Kondo | |
| 2011/0017080 | A1 | 1/2011 | Miyahara et al. | |
| 2011/0180588 | A1 | 7/2011 | Nagao | |
| 2011/0197437 | A1 | 8/2011 | Nagao | |
| 2012/0085254 | A1 | 4/2012 | Nagao | |
| 2012/0090484 | A1 | 4/2012 | Miyahara et al. | |
| 2012/0201587 | A1 | 8/2012 | Kato et al. | |

FOREIGN PATENT DOCUMENTS

| | | |
|---|---|---|
| CN | 1942059 A | 4/2007 |
| CN | 101032880 A | 9/2007 |
| CN | 101686635 A | 3/2010 |
| JP | A-62-84871 | 4/1987 |
| JP | U-62-200430 | 12/1987 |
| JP | 02-207590 | 8/1990 |
| JP | A-2-207590 | 8/1990 |
| JP | 04-129630 | 4/1992 |
| JP | A-4-331151 | 11/1992 |
| JP | A-07-241977 | 9/1995 |
| JP | 10-044371 | 2/1998 |
| JP | A-10-58649 | 3/1998 |
| JP | A-2000-263749 | 9/2000 |
| JP | A-2001-150631 | 6/2001 |
| JP | A-2001-326497 | 11/2001 |
| JP | A-2002-036695 | 2/2002 |
| JP | A-2002-240239 | 8/2002 |
| JP | A-2003-170564 | 6/2003 |
| JP | A-2004-104075 | 4/2004 |
| JP | 2004-142299 | 5/2004 |
| JP | 2005-081745 A | 3/2005 |
| JP | 2006-001057 | 1/2006 |
| JP | A-2006-69011 | 3/2006 |
| JP | A-2006-321106 | 11/2006 |
| JP | A-2007-15307 | 1/2007 |
| JP | A-2007-38456 | 2/2007 |
| JP | A-2007-125757 | 5/2007 |
| JP | A-2009-252808 | 10/2009 |
| JP | 2010-087449 A | 4/2010 |
| JP | 2010-087450 A | 4/2010 |
| WO | WO 2009035136 A1 | 3/2009 |
| WO | WO 2009150906 A1 | 12/2009 |

OTHER PUBLICATIONS

Jun. 18, 2014 Office Action issued in U.S Appl. No. 13/643,777.
Apr. 22, 2014 Notification of Reason for Refusal issued in Japanese Patent Application No. 2010-110426 (with English Translation).
Dec. 20, 2012 International Preliminary Report on Patentability issued in International Patent Application No. PCT/JP2011/060071 (with English Translation).
Feb. 18, 2014 Office Action issued in Japanese Patent Application No. 2010-102298 (with translation).
International Search Report issued in International Patent Application No. PCT/JP2011/060071 dated May 31, 2011.
Office Action issued in Chinese Patent Application No. 201180021130.8 dated Dec. 4, 2013 (with translation).
International Preliminary Report on Patentability issued in International Patent Application No. PCT/JP2011/060072 dated Dec. 10, 2012.
International Preliminary Report on Patentability issued in International Patent Application No. PCT/JP2011/060070 dated Dec. 10, 2012.
Chinese Office Action in Application No. 201180020686.5 mailed Dec. 2, 2013 (with English Translation).
Chinese Office Action in Application No. 2011800206884.4 mailed Dec. 3, 2013 (with English Translation).
U.S. Office Action in U.S. Appl. No. 13/643,567 mailed Feb. 13, 2014.
Jul. 29, 2014 Notification of Second Office Action issued in Chinese Patent Application No. 201180020686.5 (with English Translation).
Aug. 12, 2014 Notification of Reason for Refusal issued in Japanese Patent Application No. 2010-245587 (with English Translation).
Aug. 12, 2014 Notification of Reason for Refusal issued in Japanese Patent Application No. 2010-110426 (with English Translation).

* cited by examiner

SCREEN PRINTING MACHINE HAVING A SCREEN POSITION ADJUSTING DEVICE

TECHNICAL FIELD

The present invention relates to a screen printing machine and in particular to an improvement of a screen printing machine configured to print solder cream on a circuit substrate.

BACKGROUND ART

A screen printing machine is for moving a squeegee by a squeegee moving device along a mask to print a printable material on a printing object through a through hole of the mask. This screen printing machine is widely used for printing solder cream (hereinafter abbreviated as "solder" unless otherwise required) on a circuit substrate, and Patent Document 1 below discloses one example of this machine, for which user's demands are stiff as compared to a general screen printing machine. For example, the solder needs to be printed extremely precisely on a pad formed on the circuit substrate. Thus, as described in Patent Document 1, fiducial marks are provided respectively on the circuit substrate and the mask, and an imaging device is moved into a space between the circuit substrate and the mask in a state in which the circuit substrate and the mask are spaced apart from each other. In this state, the imaging device takes images of the fiducial marks of the circuit substrate and the mask, for example, to detect a relative positional error of the circuit substrate and the mask, and based on the detection a position of the circuit substrate or the mask is adjusted.

As described in Patent Document 1, the position of the circuit substrate is conventionally adjusted by moving a substrate support device supporting the circuit substrate, in a right and left direction and a front and rear direction perpendicular to each other in a horizontal plane and by rotating the substrate support device about its vertical rotation axis, while a position of the mask, as described in Patent Document 1, is conventionally adjusted by moving and rotating a mask frame supporting the mask with respect to a mask frame receiver. In these techniques, however, there is still room for improvements as described below.

PRIOR ART DOCUMENT

Patent Document

Patent Document 1: JP-A-2007-38456

SUMMARY OF THE INVENTION

Problem to be Solved by the Invention

The increase in precision of the positioning of the circuit substrate and the mask is one example of the stiff demands for the screen printing machine for printing the solder on the circuit substrate. Other examples of the stiff demands include a smaller space in which the screen printing machine is placed, a further reduction in a manufacturing cost, and an improved usability. The present invention has been developed to improve the conventional screen printing machine to satisfy at least one of these demands.

Means for Solving Problem

The above-described problem is solved, for example, by a screen printing machine for printing the solder on the circuit substrate, wherein a squeegee and a squeegee moving device are held by a mask frame receiver for receiving a mask frame. A mask is held by the mask frame, and the mask frame is received by the mask frame receiver, whereby the mask is held by a main body frame of the screen printing machine. The squeegee and the squeegee moving device are held by the mask frame receiver.

Effect of the Invention

In a conventional screen printing machine, a mask frame receiver, a squeegee moving device, and a squeegee are held directly by a main body frame of the screen printing machine. In this construction, the screen printing machine inevitably has a large size. The mask frame receiver needs to be formed to have such a size that can receive a mask frame which is for a mask having the largest size to be used in the screen printing machine. Thus, the mask frame receiver inevitably has a considerably large size. Further, if the mask frame receiver, the squeegee moving device, and the squeegee are held directly by the main body frame of the screen printing machine, the main body frame inevitably has a large size.

In contrast, where the squeegee and the squeegee moving device are held by the mask frame receiver and held indirectly by the main body frame via the mask frame receiver, a main body can be reduced in size, leading to a reduction in size of an entirety of the screen printing machine.

Forms of the Invention

There will be described by way of examples forms of inventions recognized to be claimable by the present applicant. The inventions may be hereinafter referred to as "claimable inventions", and include the invention as defined in the appended claims (which may be referred to as "the invention" or "the invention of the present application"), an invention of a concept subordinate or superordinate to the concept of the invention of the present application, and/or an invention of a concept different from the concept of the invention of the present application. The forms are numbered like the appended claims and depend on another form or forms, where appropriate. This is for easier understanding of the claimable invention, and it is to be understood that combinations of constituent elements that constitute the claimable inventions are not limited to those of the following forms. That is, the claimable inventions are to be construed by taking account of the description following each form, the description of the embodiments, the related art, the common general technical knowledge, and others, and as long as the claimable inventions are constructed in this way, any form in which one or more elements are added to or deleted from any one of the following forms may be considered as one form of the claimable invention.

In the following forms, form (1) corresponds to claim 1, form (2) corresponds to claim 2, form (3) corresponds to claim 3, form (5) corresponds to claim 4, and form (7) corresponds to claim 5. Further, a form in which technical features in forms (6), (8), and (9) are added to any one of claims 2 through 4 corresponds to claim 6, and form (13) corresponds to claim 7.

(1) A screen printing machine configured to move a squeegee by a squeegee moving device along a mask to print solder cream on a circuit substrate through a through hole of the mask, wherein a squeegee device including the squeegee and the squeegee moving device is held by a mask frame receiver configured to receive a mask frame for the mask.

(2) The screen printing machine according to the above form (1), wherein the screen printing machine includes a main body frame configured to hold a substrate support device and the mask frame receiver such that the substrate support device configured to support the circuit substrate is unmovable relative to the main body frame at least in a parallel direction that is parallel to the mask and such that the mask frame receiver is movable relative to the main body frame in the parallel direction, and wherein a position adjusting device configured to adjust a position of the mask frame receiver relative to the substrate support device in the parallel direction is provided between the mask frame receiver and the main body frame.

In the screen printing machine (hereinafter abbreviated as "printer" unless otherwise required) according to the present form, the adjustment of the position of the mask frame receiver eliminates a relative positional error between the mask and the circuit substrate supported by the substrate support device. The squeegee device is held by the mask frame receiver so as to be moved together with the mask frame receiver. Therefore, when the position of the mask frame receiver is adjusted, this adjustment does not change a relative position between the mask and the squeegee, achieving at least one of the following effects.

If the mask is rotated about a vertical rotation axis, a relative inclination between through holes formed in the mask and a longitudinal direction of the squeegee is changed, which may change a state in which the through holes are filled with the solder. However, an occurrence of such a case is avoided. Further, in a case where a pressing force of the squeegee on the mask is automatically changed in one printing depending upon, for example, a shape, a dimension, a direction, and/or a density of the through holes of the mask, the pressing force can be controlled precisely.

Further, in a case where the substrate conveyor device for conveying the circuit substrate can be divided into an in-conveyor for loading the circuit substrate into the printer, a main conveyor operable to cooperate with the substrate support device, and an outconveyor for unloading the circuit substrate from the printer, the printer can be made small-sized easily in particular. If a position of the substrate support device is adjusted in a conventional manner in the printer including such a substrate conveyor device, clearances for adjusting positions need to be formed between the in-conveyor and the main conveyor and between the outconveyor and the main conveyor. In this case, a total length of the in-conveyor, the outconveyor, and the main conveyor is inevitably relatively long. If the clearances among the three conveyors are additionally upsized, the total length is made much longer, leading to a larger size of the printer. In contrast, no devices usually need to be provided on sides of the mask frame receiver and the squeegee device. Thus, even if clearances are provided on the sides for the position adjustment, the printer is not upsized in most cases.

(3) The screen printing machine according to the above form (2), wherein the position adjusting device is configured to adjust a first position and a second position of the mask frame receiver respectively in a first direction and a second direction which intersect each other in an adjustment plane parallel to the parallel direction, the position adjusting device being configured to adjust a rotational position of the mask frame receiver about a rotation axis perpendicular to the adjustment plane.

(4) The screen printing machine according to the above form (3), wherein the position adjusting device includes:

two first slides provided at respective two positions spaced apart from each other in the first direction such that positions of the two first slides in the second direction are adjustable;

two second slides respectively held by the two first slides so as to be movable in the first direction;

two first rotational members fixed to the mask frame receiver and respectively held by the two second slides such that each of two first rotational members is rotatable about a rotation axis perpendicular to the adjustment plane;

a third slide provided at a position spaced apart from the two first slides in the second direction, such that a position of the third slide in the first direction is adjustable;

a fourth slide held by the third slide so as to be movable in the second direction; and a second rotational member fixed to the mask frame receiver and held by the fourth slide so as to be rotatable about a rotation axis perpendicular to the adjustment plane.

(5) The screen printing machine according to the above form (4), wherein the position adjusting device includes:

two first drive devices capable of driving the two first slides in the second direction independently of each other;

a second drive device capable of driving the third slide in the first direction; and an adjustment control device configured to execute a relational control of the two first drive devices and the second drive device to adjust the first position, the second position, and the rotational position of the mask frame receiver.

In the construction according to the previous and present forms, it becomes easy to compactly construct the position adjusting device.

(6) The screen printing machine according to any one of the above forms (2) through (5), further comprising:

an elevating and lowering device configured to elevate and lower the substrate support device in a direction perpendicular to the mask;

a mask cleaning device held by the main body frame so as to be allowed to enter into a space between the mask frame receiver and the substrate support device by the lowering of the substrate support device by the elevating and lowering device, the mask cleaning device being configured to clean the mask; and a cleaning-device moving device configured to move the mask cleaning device in a cleaning-device movement direction that is parallel to the mask received by the mask frame receiver.

(7) The screen printing machine according to the above form (6), further comprising a cleaning-related control section configured to execute a relational control for controlling the cleaning-device moving device and the position adjusting device to set a relative moving path of the mask cleaning device and the mask received by the mask frame, as a curve.

Since the cleaning-device moving device is configured to move the mask cleaning device linearly, a path along which the mask cleaning device is moved with respect to the lower face of the mask is linear, leading to a shortage of the cleaning effect. In contrast, the position adjusting device is capable of moving the mask also in directions parallel to or intersecting the direction in which the mask cleaning device is moved by the cleaning-device moving device or rotating the mask about its vertical rotation axis. Thus, where these movements of the mask are combined with the movement of the mask cleaning device by the cleaning-device moving device, it is possible to set a path along which the mask cleaning device is moved with respect to the lower face of the mask as a curve, that is, it is possible for the mask cleaning device to perform a wiping operation with a greater wiping effect.

(8) The screen printing machine according to the above form (6) or (7), wherein a maximum distance in which the position adjusting device is capable of moving the mask frame receiver in a direction parallel to the cleaning-device movement direction is made greater than a maximum distance in which the position adjusting device needs to move the mask frame receiver to adjust relative positions between the mask and the circuit substrate, thereby to establish a state in which the mask received by the mask frame receiver does not interfere with access to the mask cleaning device in a state in which the mask cleaning device is moved to a moving end position at least one of near a front portion of the screen printing machine and near a rear portion thereof.

In the invention according to the present form, the position adjusting device for the mask frame receiver has a function of moving the mask frame receiver also in the direction parallel to the direction in which the mask cleaning device is moved. This configuration is utilized to make the distance of the available movement in this direction greater than the distance of the available movement required for the position adjustment. As a result, the mask frame receiver and the mask frame held by the mask frame receiver are retracted from a position located on an upper side of the mask cleaning device that is located at the moving end portion near the front portion or the rear portion, enabling the access to the mask cleaning device. This facilitates maintenance operations and suppresses an increase in manufacturing cost of the printer.

(9) The screen printing machine according to the above form (8), further comprises a cover device configured to cover an inner space of the screen printing machine, and the cover device includes an open/close door movable selectively to one of an open position at which the open/close door opens a portion of the inner space near the front portion of the screen printing machine in at least one of a frontward direction and an upward direction; and a closing position at which the open/close door closes the portion of the inner space near the front portion, wherein the moving end position at which the mask received by the mask frame receiver does not interfere with the access to the mask cleaning device is the moving end position near the front portion of the screen printing machine.

The construction according to the present form facilitates the access to the mask cleaning device from a front side of the printer, thereby facilitating frequently-performed maintenance operations such as a replacement of the cleaning sheet. The open/close door is preferably configured to open the inner space in both of the frontward and upward directions.

(10) The screen printing machine according to any one of the above forms (6) through (9), wherein the mask cleaning device includes:

a first-roll holding device configured to hold a first roll on which an unused cleaning sheet is rolled, such that the first roll is rotatable about an axis thereof;

a second-roll holding device configured to hold a second roll on which a used cleaning sheet is rolled, such that the second roll is rotatable about an axis thereof, the second-roll holding device being provided at a position distant from the first-roll holding device in a direction parallel to a direction of the movement by the cleaning-device moving device;

a cleaning-liquid applying head configured to apply cleaning liquid onto a cleaning sheet spanning between the first roll and the second roll; and an applying-head moving device configured to hold the cleaning-liquid applying head and move the cleaning-liquid applying head in a direction parallel to the axes of the first and second rolls, the applying-head moving device being capable of changing a range of the movement of the cleaning-liquid applying head.

It is possible to change a width of the cleaning sheet depending upon a cleaning-required-area of the mask and to make the width of the cleaning sheet unchangeable regardless of the cleaning-required-area. In any case, however, the cleaning liquid only needs to be applied to an area of the cleaning sheet which corresponds to the cleaning-required-area. In the construction according to the present form, a consumption of the cleaning liquid can be reduced.

The mask cleaning device according to the present form can be employed independently of the feature(s) of at least one of the forms (6) through (9).

(11) The screen printing machine according to the above form (10), the cleaning-liquid applying head and the applying-head moving device are provided on a rear portion of the screen printing machine.

The cleaning-liquid applying head and the applying-head moving device are preferably provided at a position at which the cleaning liquid is supplied onto the cleaning sheet or a position at a rear of a space located on an upper side of the mask frame receiver in a state in which the mask cleaning device has been moved to its moving end position near the rear portion.

(12) The screen printing machine according to any one of the above forms (1) through (11), wherein the mask frame receiver and the squeegee device are provided on a front portion of the screen printing machine.

Operations required for the printer include many operations relating to the mask and the squeegee. The construction in the present form permits an operator to perform such operations from a front side of the printer, thereby improving workability.

The feature in the present form can be employed independently of at least one of the forms (1) through (11).

(13) The screen printing machine according to the above form (12), further comprising a cover device configured to cover an inner space of the screen printing machine, and the cover device includes an open/close door movable selectively to one of an open position at which the open/close door opens a portion of the inner space near the front portion of the screen printing machine in at least one of a frontward direction and an upward direction; and a closing position at which the open/close door closes the portion of the inner space near the front portion, wherein the mask frame receiver and the squeegee device are provided at positions to which an operator at a front of the screen printing machine is accessible in a state in which the open/close door is located at the open position.

(14) The screen printing machine according to any one of the forms (1) through (13), further comprising:

a front conveyor configured to load the circuit substrate into the substrate support device and unload the circuit substrate from the substrate support device;

a rear conveyor provided at a rear side of the front conveyor and configured to allow the circuit substrate to pass through the screen printing machine.

In this construction, the printer has a function of allowing the passage of the circuit substrate, facilitating a construction of a printing line through which a circuit substrate on which solder has been printed is supplied by a plurality of the printers in a single electronic-circuit-component mounting line. Further, the mask frame receiver and the squeegee device are provided in a front portion of the printer.

(15) The screen printing machine according to the form (14), wherein the front conveyor includes:

a main conveyor configured to cooperate with the substrate support device; and at least one of an in-conveyor provided upstream of the main conveyor and configured to load the circuit substrate into the screen printing machine and an outconveyor provided downstream of the main conveyor and configured to unload the circuit substrate from the screen printing machine.

(20) A mask cleaning device, further comprising:

a first-roll holding device configured to hold a first roll on which an unused cleaning sheet is rolled, such that the first roll is rotatable about an axis thereof;

a second-roll holding device configured to hold a second roll on which a used clearing sheet is rolled, such that the second roll is rotatable about an axis thereof, the second-roll holding device being provided at a position distant from the first-roll holding device in a direction parallel to a direction of the movement by the cleaning-device moving device;

a pressing member configured to press, onto a lower face of the mask, the cleaning sheet located between the first roll and the second roll; and a pressing-member drive device configured to have the pressing member come into contact with or come off the mask, with the cleaning sheet being interposed therebetween.

The mask cleaning device according to the present form is applicable to the screen printing machine according to any one of the forms (1) through (15).

(21) The mask cleaning device according to the form (20), wherein the mask cleaning device includes a pivot allowing device configured to allow a pivot of the pressing member about a pivot axis that is parallel to the lower face of the mask.

The pivot allowing device may be a device provided between the pressing member and the pressing-member drive device for allowing the pivot of the pressing member with respect to the pressing-member drive device. Alternatively, the pivot allowing device may be a device supporting the pressing-member drive device pivotably to allow the pivot of the pressing member together with the pressing-member drive device.

In the construction according to the present form, a cleaning effect can be improved by a uniformed contact surface pressure of the cleaning sheet on the lower face of the mask.

(22) The mask cleaning device according to the form (20) or (21), wherein the pressing member has a pressing face to contact the cleaning sheet, the pressing face having a suction opening for sucking an air through the cleaning sheet, and wherein a negative-pressure generating device configured to generate a negative pressure by ejecting a pressurized air is provided in a suction chamber communicating with the suction opening.

It is possible to reliably remove solder remaining in the through hole of the mask, solder wiped by the cleaning sheet, and/or cleaning liquid having flowed out to an upper face of the mask.

(23) The mask cleaning device according to the form (22), wherein the suction opening is an elongated member extending in a longitudinal direction thereof that is parallel to the axes of the first and second rolls, wherein the suction chamber extends in a direction parallel to the longitudinal direction of the suction opening, wherein the suction opening communicates with the suction chamber across an entire length of the suction opening, and wherein the negative-pressure generating device is provided in a central portion of the suction chamber in a longitudinal direction thereof.

It is possible to perform uniform suction across the entire length of the elongated suction opening.

(30) A squeegee device comprising;

a pair of horizontal guides provided parallel to each other and spaced apart from each other at a predetermined distance;

a squeegee slide operable to be guided by the horizontal guides;

a squeegee-slide driving device configured to move the squeegee slide along the pair of horizontal guides;

a first elevating and lowering member capable of elevating and lowering with respect to the squeegee slide;

a second elevating and lowering member capable of elevating and lowering with respect to the first elevating and lowering member;

an elevating and lowering drive device provided between the first elevating and lowering member and the second elevating and lowering member to elevate and lower the second elevating and lowering member with respect to the first elevating and lowering member;

a squeegee held by the second elevating and lowering member; and an elastic member and a load detector provided in series between the squeegee slide and the first elevating and lowering member.

When compared with a conventional construction in which the load detector is provided between the squeegee and an elevating and lowering member that is elevated and lowered by the elevating and lowering drive device, where the load detector is provided between a main body of the squeegee and the first elevating and lowering member, the following effects can be obtained: the load detector does not need to be elevated and lowered by the elevating and lowering drive device; the elevating and lowering drive device can be made small-sized; and because the load detector is not elevated or lowered, or elevated and lowered for just a small distance, wiring can be carried out easily, and trouble is less frequently caused. Further, where a pair of the second elevating and lowering members, the elevating and lowering drive devices, and the squeegees are provided for the one first elevating and lowering member, sharing of the load detector provides a unique effect of reducing manufacturing cost. The above effects can be obtained even where the elastic member is not provided in series with the load detector, and this mode is one of the claimable inventions.

Furthermore, the invention according to the present form has the feature in which the elastic member is provided in series with the load detector. Thus, an amount of change of a pressing load of the squeegee with respect to a unit operation amount of the elevating and lowering drive device is small, thereby facilitating a control of the pressing load by a control of the operation amount by the elevating and lowering drive device.

The feature in the present form is also applicable to the screen printing machine according to any one of the forms (1) through (15) and can be employed by being combined with the mask cleaning device according to any one of the forms (20) through (23).

(31) The squeegee device according to the form (30), further comprising a tension-corresponding-amount obtaining section configured to:

operate the elevating and lowering drive device in a state in which the mask does not contact the circuit substrate, to press one of the squeegee and a detection element that is different from the squeegee onto the mask; and based on an amount of the operation of the elevating and lowering drive device and a load detected by the load detector, obtain a tension corresponding amount that corresponds to a tension of the mask one to one.

In a case where there is no problem if the mask is curved with a relatively large degree by the pressing with the squeegee, the mask is pressed by the squeegee. Otherwise, the mask is pressed by the detection element. In any case, a state of the tension of the mask can be easily detected. The tension of the mask usually lowers with use. Since the lowering of the tension may cause a deterioration of a printing accuracy, if the tension is equal to or lower than a predetermined state (i.e., a predetermined tension), the operator is preferably notified of this state to urge the operator to replace the mask.

The feature in the present form can be employed independently of the feature in the form (30).

(32) The squeegee device according to the form (30) or (31), further comprising a squeegee-release control section configured to control the elevating and lowering drive device to control a release of the squeegee from the solder cream.

When the squeegee is spaced apart from the solder after one recording operation is finished, a part of the solder adheres to the squeegee and is drawn from the solder, and a roll-like shape of the solder may be distorted, or an air may be trapped in the solder to form air bubbles. Since these situations may adversely affect a print quality, it is preferable that these situations are prevented from occurring. According to the invention in the present form, this object can be reliably achieved. It is more preferable that the squeegee-release control section is configured to control the release based on a result of the detection of the load detector.

(40) A solder-cream supply device of a screen printing machine configured to print solder cream onto a circuit substrate by a squeegee through a plurality of through holes formed in a mask, the solder-cream supply device comprising:

a movable member movable along a guide that is parallel to a longitudinal direction of the squeegee;

a pivot member held by the movable member so as to be pivotable about a pivot axis perpendicular to the longitudinal direction of the squeegee and parallel to the mask;

a container holding device provided on the pivot member and configured to removably hold a solder-cream container that contains the solder cream and has an ejection opening at one end thereof;

an ejection drive device configured to have the solder-cream container eject the solder cream from the ejection opening;

a movable-member drive device configured to drive the movable member;

a pivot-member drive device configured to pivot the pivot member; and a control device configured to control the ejection drive device, the movable-member drive device, and the pivot-member drive device such that the solder-cream container is normally held in an orientation in which the ejection opening faces in a lateral direction and such that, when the solder cream is supplied, the solder-cream container is pivoted to an orientation in which the ejection opening faces downward, and the solder cream is ejected from the ejection opening onto the mask while the solder-cream container is moved along a path parallel to the mask.

The solder-cream container can be kept in the orientation in which the ejection opening faces downward. In this case, however, the solder may be dropped downward from the ejection opening by its own weight. Thus, it is preferable that the solder-cream container is normally kept in the orientation in which the ejection opening faces in the lateral direction.

The solder-cream supply device in the present form is also applicable to the screen printing machine according to any one of the forms (1) through (15) and can be employed by being combined with any of the mask cleaning device according to any one of the forms (20) through (23) and the squeegee device according to any one of the forms (30) through (32).

(41) The solder-cream supply device according to the form (40), further comprising an opposite-moment apply device configured to apply an opposite moment to the solder-cream container in a state in which a maximum amount of the solder cream is stored in the solder-cream container, wherein the opposite moment is a rotation moment in a direction opposite a direction of a rotation moment for urging the solder-cream container toward the vertical orientation, and the opposite moment is less than a maximum moment as the rotation moment for urging the solder-cream container toward the vertical orientation.

Where the opposite-moment apply device is configured to apply the opposite moment that is equal in magnitude to the maximum moment, the pivot-member drive device needs no driving moment for rotating the solder-cream container in a state in which the solder-cream container stores the maximum amount of the solder cream, but in a state in which the solder-cream container stores a minimum amount of the solder cream, a driving moment generally equal to the opposite moment is required. Thus, the opposite-moment apply device preferably applies the opposite moment that is half the maximum moment in magnitude. In this case, the pivot-member drive device can be configured to generate a half of a driving torque when compared with a case where the opposite-moment apply device is not provided. The opposite-moment apply device, for example, is preferably a device including at least one of a counterweight and a spring.

EMBODIMENT

Hereinafter, there will be described one embodiment of the claimable invention by reference to the drawings. It is to be understood that the claimable invention is not limited to the embodiment described below, and may be otherwise embodied with various changes and modifications, such as those described in the foregoing "FORMS OF THE INVENTION", which may occur to those skilled in the art.

Figure 1:
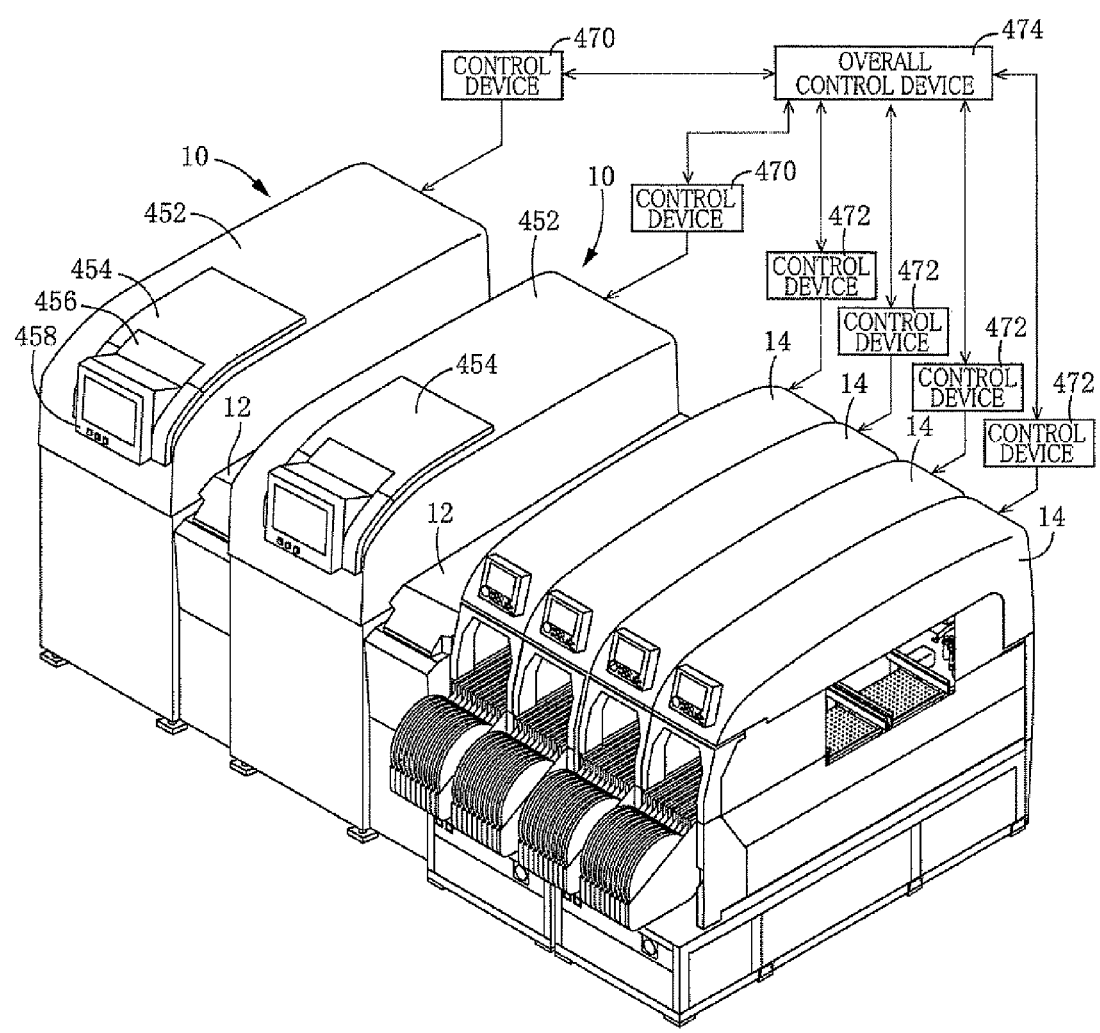
FIG. 1 is a perspective view showing an electronic-circuit assembly line including screen printing machines each as one embodiment of the claimable invention.

FIG. 1 shows an electronic-circuit assembly line including printers (screen printing machines) each as one embodiment of the claimable invention. This electronic-circuit assembly line includes a plurality of printers 10, in the illustrated example, two printers 10, a plurality of shuttle conveyors 12, in the illustrated example, two shuttle conveyors 12, and a plurality of mounting machines (electronic-circuit-component mounting machines) 14, in the illustrated example, four mounting machines 14. Each of the printers 10 and the mounting machines 14 is one kind of a substrate working machine for achieving an operation in a circuit substrate, and the electronic-circuit assembly line is one kind of a substrate working line. The two printers 10 are provided adjacent to each other at positions upstream of the four mounting machines 14 in a direction in which the circuit substrate is conveyed in the electronic-circuit assembly line. One of the two shuttle conveyors 12 is provided between the two printers 10, and the other is provided between the downstream printer 10 and one of the mounting machines 14 which is adjacent to the printer 10. In the present description, a substrate conveying direction as the direction in which the circuit substrate is conveyed is defined as a right and left direction, and a direction perpendicular to the substrate conveying direction is defined as a front and rear direction. In the present embodiment, each of the right and left direction and the front and rear direction is horizontal.

The two sets of the two printers 10 and the two shuttle conveyors 12 are identical in construction with each other. Thus, the upstream printer 10 and the upstream shuttle conveyor 12 will be explained by way of example.

Figure 2:
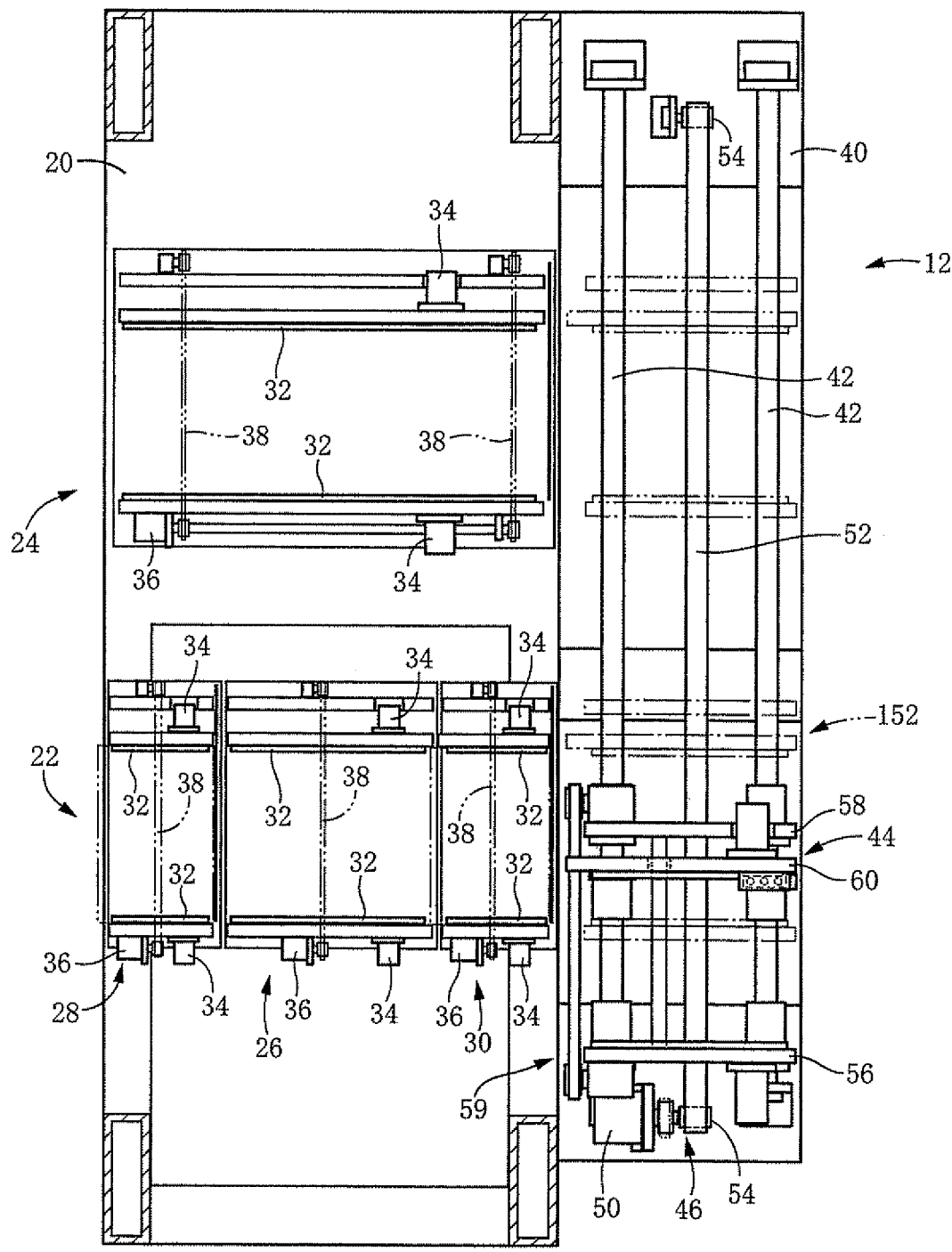
FIG. 2 is a plan view showing a substrate conveyor device of the screen printing machine and the shuttle conveyor.

As shown in FIG. 2, the printer 10 includes a printer main body 20, a front conveyor 22, and a rear conveyor 24. The front conveyor 22 is provided on a front portion of the printer main body 20, and the rear conveyor 24 is provided on a rear portion of the printer main body 20. The front conveyor 22 includes a main conveyor 26, and an in-conveyor 28 and an outconveyor 30 respectively disposed upstream and downstream of the main conveyor 26 in the substrate conveying direction. Each of the main conveyor 26, the in-conveyor 28, and the outconveyor 30 is constituted by a belt conveyor and includes a pair of conveyor belts 32 and belt rotating devices 34 for respectively rotating the conveyor belts 32 to convey the circuit substrate with its printing surface being horizontal. Depending upon a width of the circuit substrate to be conveyed, a conveyor width (i.e., a distance between the pair of conveyor belts 32 of each conveyor) is changed by a width change device that includes a width change motor 36 and a belt 38. The rear conveyor 24 is also constituted by a belt conveyor capable of changing the conveyor width.

The shuttle conveyor 12 includes a conveyor main body 40, guides 42, a movable conveyor 44, and a movable-conveyor moving device 46. Like the front conveyor 22 and other conveyors, the movable conveyor 44 is constituted by a belt conveyor capable of changing the conveyor width. The movable-conveyor moving device 46 includes a shuttle motor 50 serving as a drive source, a belt 52, and a plurality of pulleys 54. When one of the pulleys 54 is rotated by the shuttle motor 50, a fixed side frame 56 and a support frame 58 connected to the belt 52 are moved, and a movable side frame 60 is also moved via a conveyor-width adjusting device 59, whereby an entirety of the movable conveyor 44 can be moved to any position in the front and rear direction.

Figure 3:
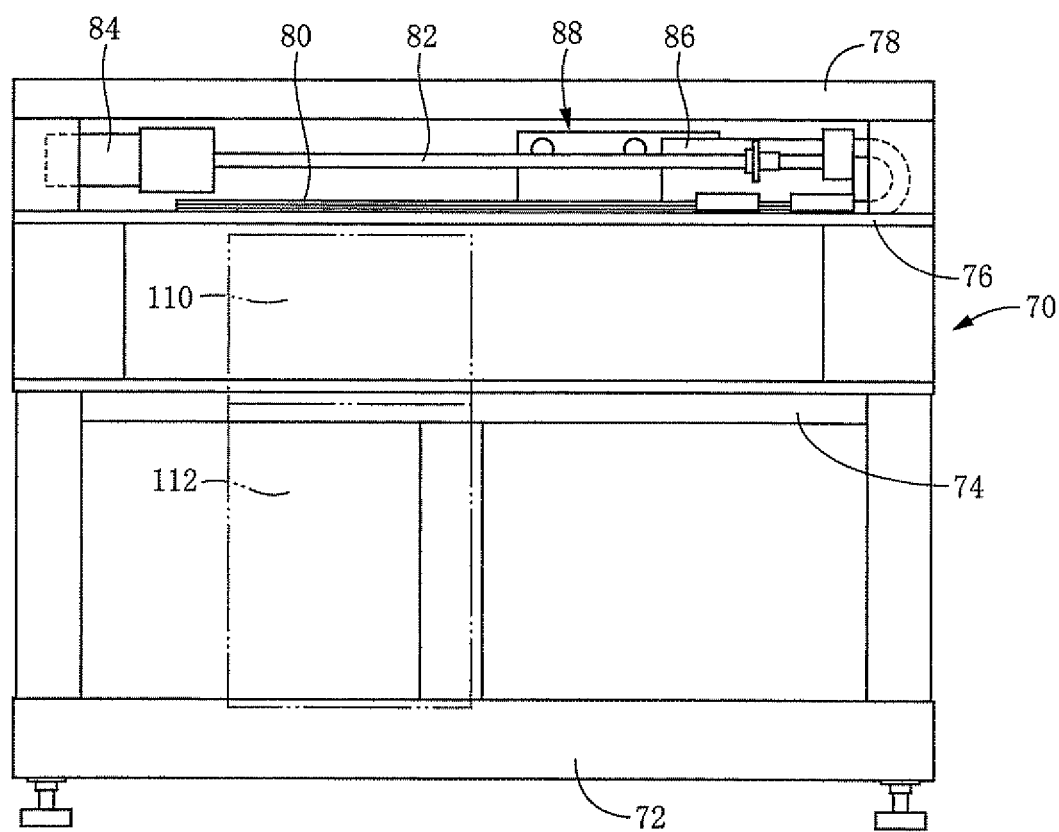
FIG. 3 is a side view showing a main body frame of the screen printing machine.
Figure 4:
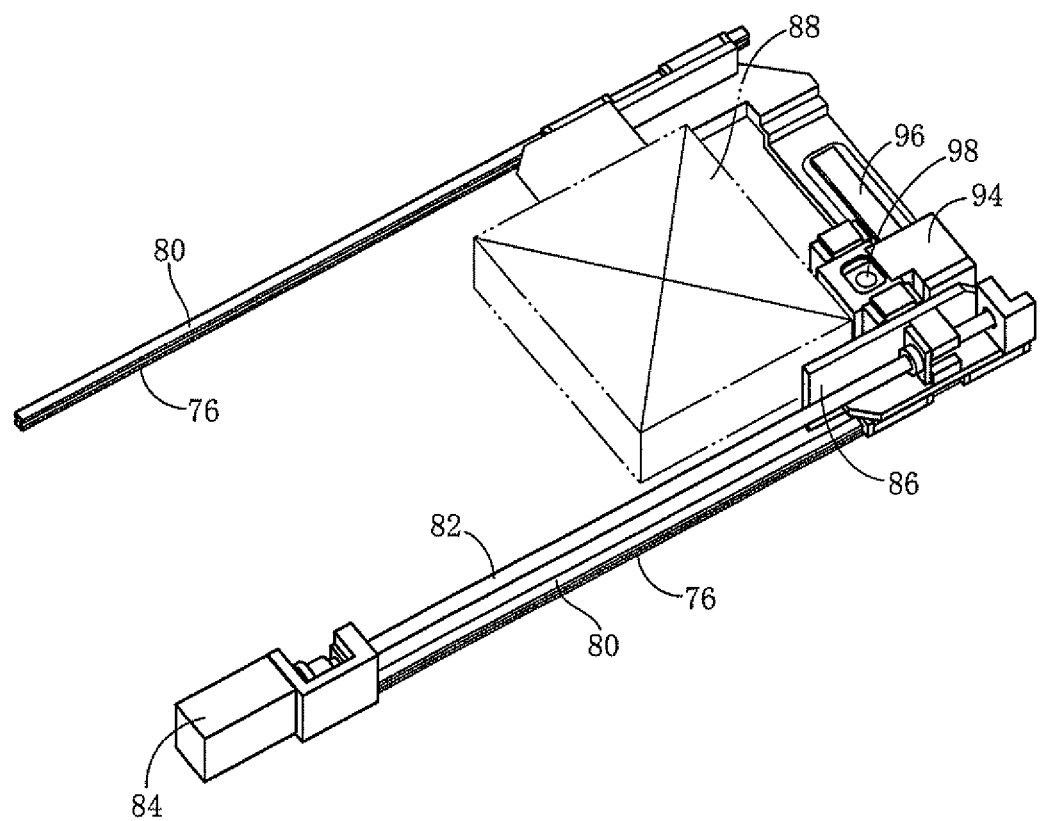
FIG. 4 is a perspective view showing a device for moving a mask cleaning device and a fiducial-mark imaging device of the screen printing machine.

A main body frame 70 principally constituting the printer main body 20 generally has a construction shown in FIG. 3 and includes two first beam members 72, two second beam members 74, two third beam members 76, and two fourth beam members 78 in order from a lower side. Each two beam members are provided on right and left portions of the main body frame 70 as a pair so as to support a left end portion and a right end portion of each of the following devices supported by the main body frame 70. As shown in FIG. 4, guides 80 are respectively provided on the pair of third beam members 76, and a feed screw 82 is provided one of the third beam members 76. The feed screw 82 is rotated by an electric motor 84, which moves a slide 86 in the front and rear direction. The feed screw 82 is preferably a ball screw, and the electric motor 84 is preferably an electric motor such as a servomotor capable of controlling a rotation angle. This applies to feed screws and electric motors described below.

A mask cleaning device 88 which will be described below in detail is mounted on the slide 86. As shown in FIG. 4, the slide 86 is provided with a slide 94 that is moved on a guide 96 in the right and left direction by a feed screw and an electric motor, not shown. On the slide 94, there is mounted a fiducial-mark imaging device 98 for taking images of fiducial marks provided on the circuit substrate and a mask which will be described below.

The front conveyor 22 and the rear conveyor 24 are provided above the second beam members 74 of the main body frame 70. In a space between the first beam members 72 and the third beam members 76, there are provided: a substrate holding device 110 including a substrate support device and a substrate clamping device; and an elevating and lowering device 112 for elevating and lowering the substrate holding device 110. Constructions of these devices are not explained in detail, and only their positions are indicated by two-dot chain lines. The substrate support device is for supporting the circuit substrate conveyed by the main, conveyor 26, from a lower side thereof and cooperates with the main conveyor 26 to constitute the substrate clamping device. The elevating and lowering device includes: a first elevating/lowering drive portion for elevating and lowering the substrate support device relative to the main conveyor 26; and a second elevating/lowering drive portion for elevating and lowering the substrate support device and the main conveyor together with each other.

Figure 5:
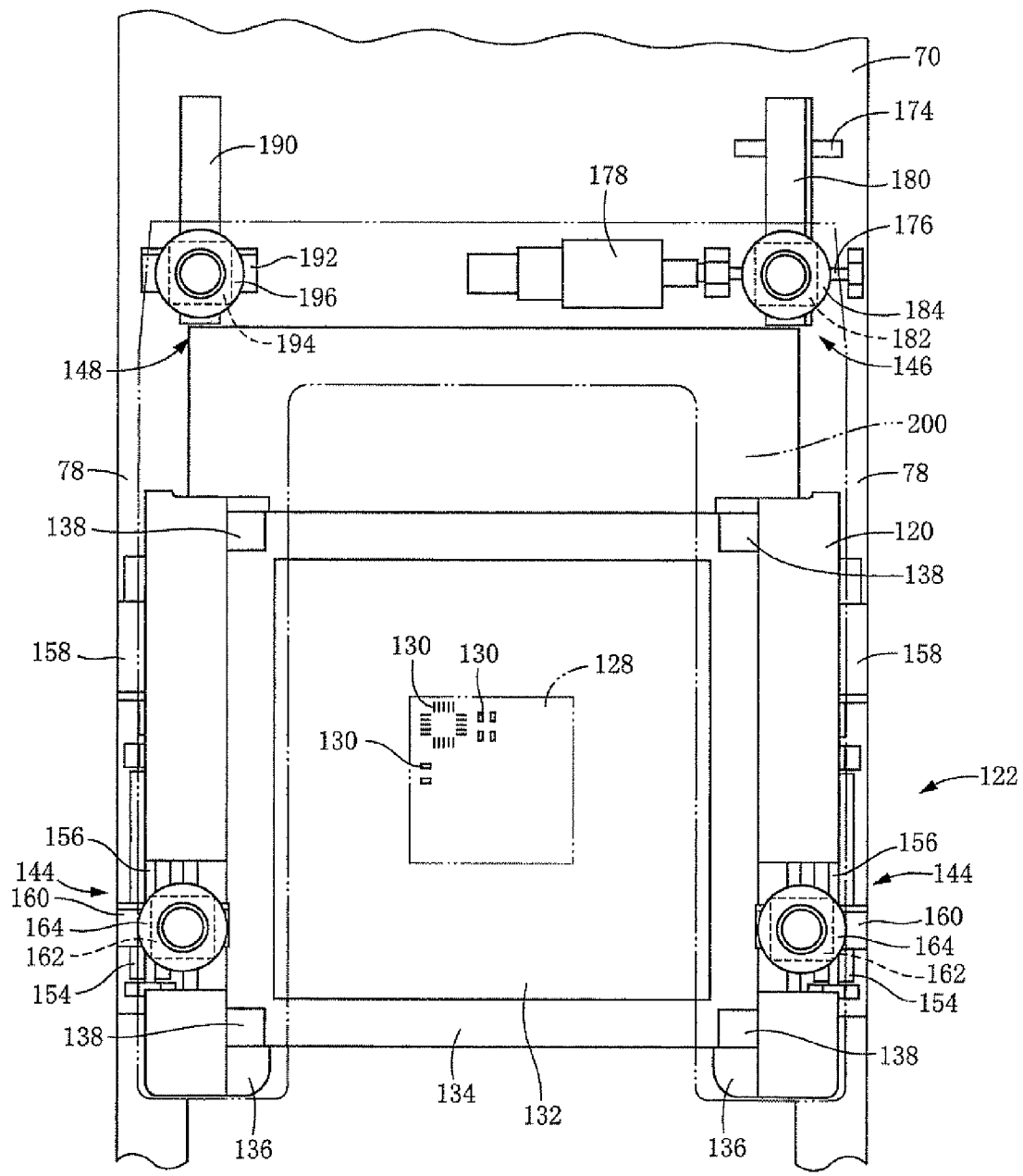
FIG. 5 is a plan view showing a mask frame receiver and a mask-position adjusting device of the screen printing machine.
Figure 6:
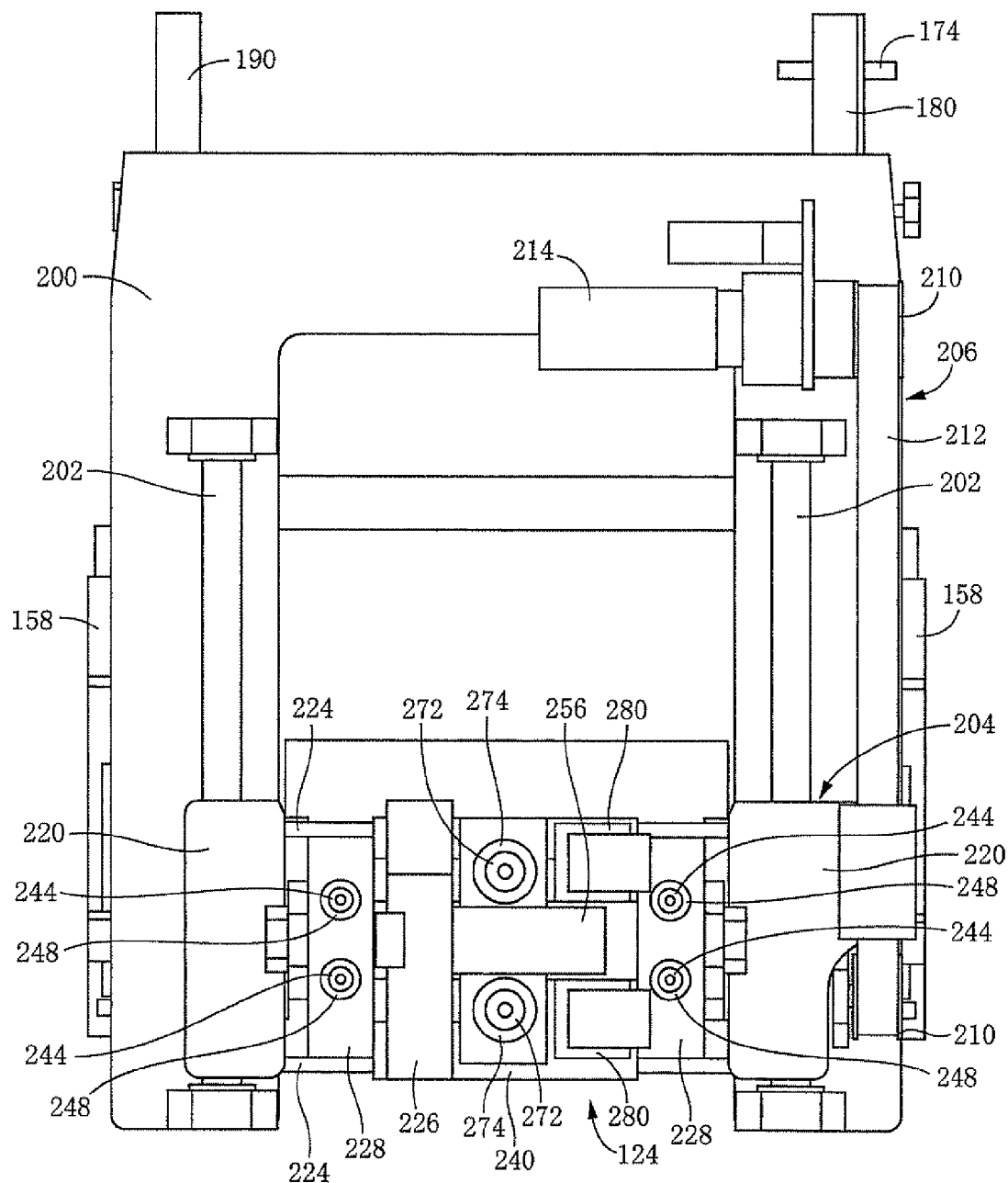
FIG. 6 is a plan view showing a squeegee device of the screen printing machine.

The pair of fourth beam members 78 support a mask frame receiver 120 and a position adjusting device 122 shown in FIG. 5 and a squeegee device 124 shown in FIG. 6. The mask frame receiver 120 receives a bottom of a mask frame 134 for holding a mask 132 having a plurality of through holes 130 in its print area 128. The mask frame receiver 120 includes a pair of receiving portions 136 and a plurality of air cylinders 138 as a holding device for forcing the mask frame 134 against the receiving portions 136 for thereby securing the mask frame 134. The position adjusting device 122 is provided between the fourth beam members 78 and the mask frame receiver 120 and configured to adjust a position of the mask frame receiver 120 to eliminate a relative positional error between the mask 132 received by the mask frame receiver 120 and the circuit substrate held by the substrate holding device 110.

Figure 7:
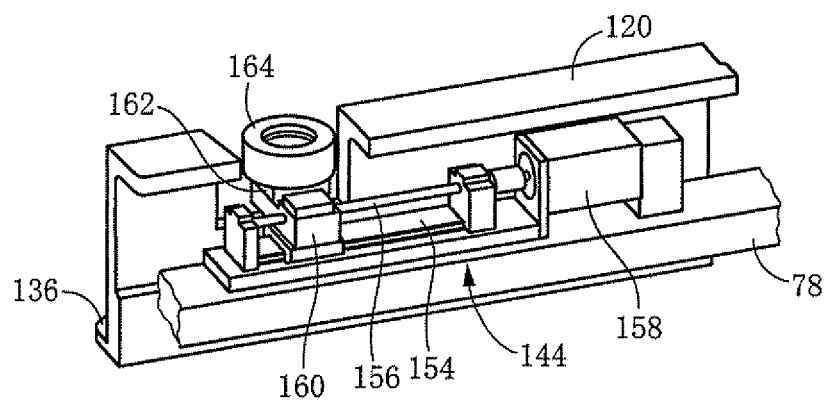
FIG. 7 is a perspective view partly showing the position adjusting device.

The position adjusting device 122 includes: two front/rear-direction adjusting units 144 spaced apart from each other in the right and left direction; one right/left-direction adjusting unit 146 spaced apart from the two front/rear-direction adjusting units 144 in the front and rear direction; and one floating support unit 148 spaced apart from the right/left-direction adjusting unit 146 in the right and left direction. As shown in one of the front/rear-direction adjusting units 144 in FIG. 7 by way of example, each of the units 144 includes: a guide 154 fixed to the fourth beam member 78 so as to extend in the front and rear direction; a feed screw 156 provided parallel to the guide 154 and not movable in its axial direction; an electric motor 158 for rotating the feed screw 156; and a slide 160. The slide 160 is moved in the front and rear direction by rotation of the electric motor 158. The slide 160 holds a slide 162 that is movable in the right and left direction relative to the slide 160. The slide 162 holds a rotational member 164 that is rotatable about its vertical rotation axis.

As shown in FIG. 5, the right/left-direction adjusting unit 146 includes a guide 174, a feed screw 176, an electric motor 178, slides 180, 182, and a rotational member 184. A fundamental construction of the right/left-direction adjusting unit 146 is the same as that of each front/rear-direction adjusting unit 144 but is different from that of the unit 144 in that the guide 174 and the feed screw 176 are provided parallel to the right and left direction and that the slide 180 is elongated in the front and rear direction, and the slide 182 is movable a long distance in the front and rear direction.

The floating support unit 148 includes: a guide 190 extending parallel to the front and rear direction; a slide 192 movable on the guide 190; a slide 194 movable on the slide 192 in the right and left direction; and a rotational member 196 held by the slide 194 so as to be rotatable about its vertical rotation axis.

In this position adjusting device 122, when only the two front/rear-direction adjusting units 144 are operated for the same amount in the same direction, the mask frame receiver 120 can be translated in the front and rear direction. When only the one right/left-direction adjusting unit 146 is operated, the mask frame receiver 120 can be translated in the right and left direction. When a relational control is executed for the two front/rear-direction adjusting units 144 and the one right/left-direction adjusting unit 146, the mask frame receiver 120 can be rotated about a vertical rotation axis located at any position. Further, a combined movement of these operations can be performed. In any of these cases, the floating support unit 148 receives a load while allowing free movement of a corresponding portion of the mask frame receiver 120 in a horizontal direction.

A squeegee-device main body 200 indicated by two-dot chain lines in FIG. 5 is fixed (secured) to an upper face of the mask frame receiver 120. As shown in FIG. 6, the squeegee-device main body 200 is a planar plate member having a U-shape in plan view, and two guides 202 are provided along two arm portions of the U-shape. These two guides 202 movably support a squeegee slide 204 that is moved in the front and rear direction by a squeegee-slide driving device 206. In the present embodiment, the squeegee-slide driving device 206 includes; a plurality of pulleys 210; a belt 212 looped over the pulleys 210; and an electric motor 214 for driving and rotating one of the pulleys 210. The pulleys 210 and the belt 212 are preferably a timing pulley and a timing belt, respectively, and the electric motor 214 is preferably an electric motor such as a servomotor capable of controlling a rotation angle. This applies to pulleys, belts, and electric motors described below.

Figure 8:
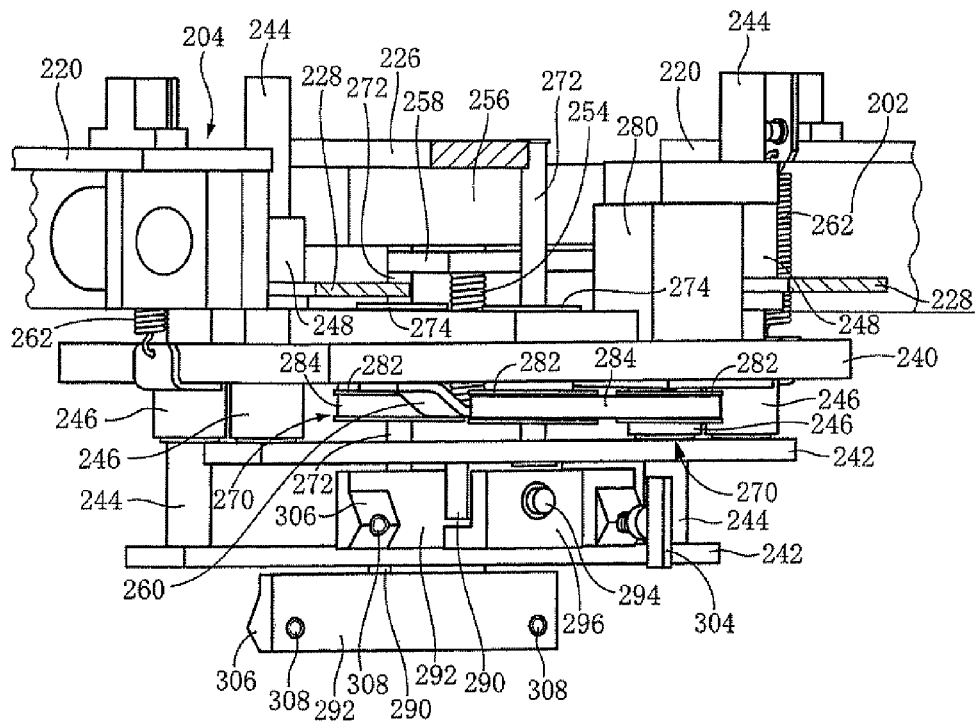
FIG. 8 is a perspective cross-sectional view showing a part of the squeegee device, with a front connecting portion of a squeegee slide being omitted.
Figure 9:
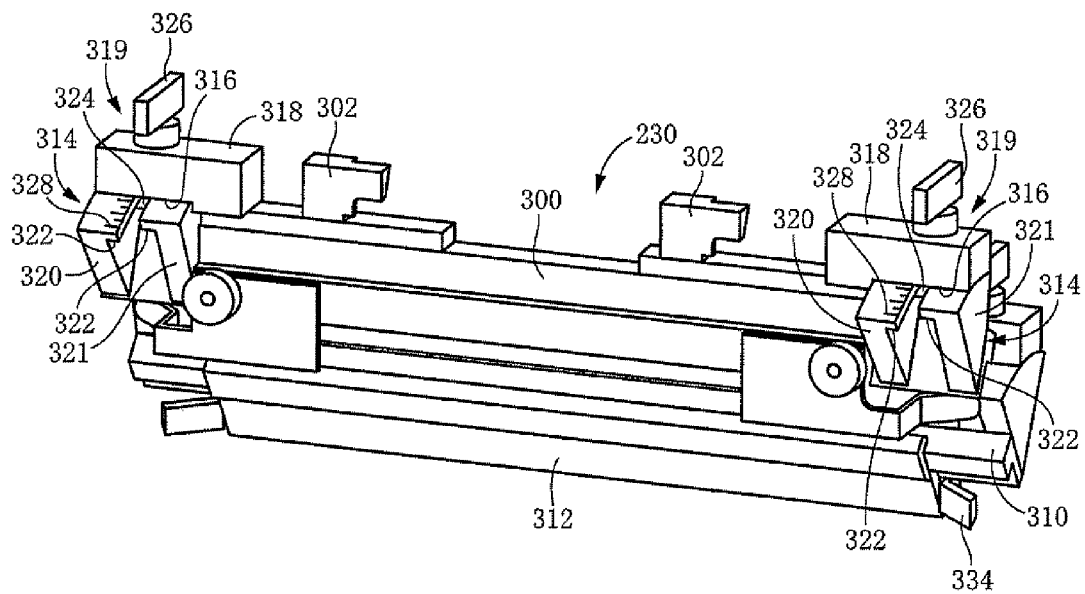
FIG. 9 is a perspective view showing a squeegee head of the squeegee device.

The squeegee slide 204 includes; two slide portions 220 respectively guided by the two guides 202; front and rear connecting portions 224 connecting between the slide portions 220; one bridge portion 226 extending in the front and rear direction so as to bridge an area between the two connecting portions 224 extending in the right and left direction; and a pair of bridge portions 228. As shown in FIG. 8, one first elevating and lowering member 240 and two second elevating and lowering members 242 are held by the squeegee slide 204 so as to be movable upward and downward relative to each other, and squeegee heads 230 shown in FIG. 9 are respectively held by the second elevating and lowering members 242.

To each of the second elevating and lowering members 242, there are fixed two guide rods 244 extending vertically upward and spaced apart from each other in the right and left direction. These guide rods 244 are slidably and respectively fitted in two sets of guide sleeves 246 provided on the first elevating and lowering member 240 and are slidably and respectively fitted in guide sleeves 248, each two of which are provided on a corresponding one of the pair of bridge portions 228. As a result, each of the two second elevating and lowering members 242 is moved upward and downward in the vertical direction with respect to the first elevating and lowering member 240 while being guided by the two guide rods 244 and the two guide sleeves 246, and the first elevating and lowering member 240 is moved upward and downward in the vertical direction with respect to the squeegee slide 204 while being guided by the four guide rods 244 and the four guide sleeves 248. Each of the guide rods 244 functions as a guide for both of the first elevating and lowering member 240 and the second elevating and lowering members 242.

As shown in FIG. 8, an elastic member in the form of a compression coil spring 254 and a load detector in the form of a load cell 256 are provided in series between a central portion of the first elevating and lowering member 240 and the squeegee slide 204. Specifically, one end portion of the elongated load cell 256 is fixed to the bridge portion 226, and the compression coil spring 254 is interposed between an input portion 258 of the load cell 256 and a spring retainer 260 of the first elevating and lowering member 240. Two elastic members in the form of extension coil springs 262 are provided between the first elevating and lowering member 240 and the squeegee slide 204. The sum of tensions of the two extension coil springs 262 is slightly larger than the sum of weights of the first elevating and lowering member 240 and components and devices held by the first elevating and lowering member 240 such as the second elevating and lowering members 242 and the squeegee heads 230. A relatively small initial compression load is applied to the load cell 256.

The two second elevating and lowering members 242 are moved upward and downward relative to the first elevating and lowering member 240 respectively by elevating and lowering drive devices 270. In the present embodiment, one of feed screws 272 is mounted in a central portion of each of the second elevating and lowering members 242 so as to face upward and extend parallel to the two guide rods 244, while two nuts 274 each rotatable and not movable in its axial direction are mounted on the first elevating and lowering member 240 and respectively screwed on the feed screws 272.

The nuts 274 are respectively rotated by electric motors 280, pulleys 282, and belts 284, whereby the second elevating and lowering members 242 are translated individually in the up and down direction.

Each of the second elevating and lowering members 242 is an elongated member, and one tab 290 extends downward from a center of the second elevating and lowering member 242 in its longitudinal direction. The tab 290 is connected to a head holding member 292 by a connecting pin 294 such that a relative pivot motion of the tab 290 is allowed. The head holding member 292 is also an elongated member, and one tab 296 is provided on a central portion of the head holding member 292. The tab 296 and the central portion of the head holding member 292 form a yoke portion. The tab 296 and the head holding member 292 are connected to each other by the connecting pin 294 in a state in which the tab 290 is fitted in the yoke portion. The head holding member 292 is pivotably held by the connecting pin 294 that supports opposite ends of the head holding member 292.

Each of the squeegee heads 230 shown in FIG. 9 is removably mounted on a corresponding one of the head holding members 292. A head main body 300 of the squeegee head 230 is provided with two hooks 302 each as a mount portion. Each of these hooks 302 is hanged on a shaft portion of a corresponding one of two securing screws 304 (noted that only one screw is illustrated in FIG. 8) respectively screwed on the head holding member 292, and each securing screw 304 is tightened by hand, whereby the head main body 300 is mounted on the head holding member 292. When the two second elevating and lowering members 242 are individually moved upward or downward, the squeegee heads 230 respectively held by the second elevating and lowering members are individually pressed onto the mask 132 or spaced apart from the mask 132.

It is noted that the securing screws 304 are, as shown in FIG. 8, respectively engaged with female threaded holes 308 formed in top portions of respective mountain-shaped projections 306 that are formed on the head holding member 292 so as to be parallel to its longitudinal direction. A V-shaped groove is formed in a face of each of the hooks 302 which is opposite the head holding member 292. An engagement of these components positions the head main body 300 with respect to the head holding member 292 in the up and down direction.

Each squeegee head 230 includes a squeegee holder 310 pivotable relative to the head main body 300. The squeegee holder 310 is for removably holding a squeegee 312 and includes: fan-shaped supported portions 314 each having an outer circumferential face along an arc centered about a lower end edge of the squeegee 312; and holding portions 318 each having a receiving face 316 along the arc. Each of the supported portions 314 is fixed (secured) to the holding portion 318 by a securing device similar to a securing device using a T-shaped groove and a T-block. Specifically, the supported portion 314 includes: fan-shaped plates 320, 321 extending upward from the squeegee holder 310 so as to be parallel to each other and respectively having faces opposite each other; and two arc-shaped narrow projections 322 projecting toward each other from edge portions of the respective opposite faces along the above-described arc, and a securing screw 326 rotatably held by the holding portion 318 is engaged with a block 324 having a T-shape in transverse cross section and engaged with these narrow projections 322. When the securing screw 326 is tightened, the two narrow projections 322 are firmly sandwiched between the holding portion 318 and the block 324, whereby the supported portion 314 is fixed (secured) to the holding portion 318. Therefore, an angle of the squeegee holder 310 relative to the head holding member 292, that is, a wedge angle of the squeegee 312 and the mask 132 is changeable to any angle, and this change is made by a pivot of the squeegee 312 about the lower end edge. A scale 328 is provided on an arc-shaped outer circumferential face of the fan-shaped plate 320, and this scale 328 indicates the above-described wedge angle with an edge of the holding portion 318.

Figure 10:
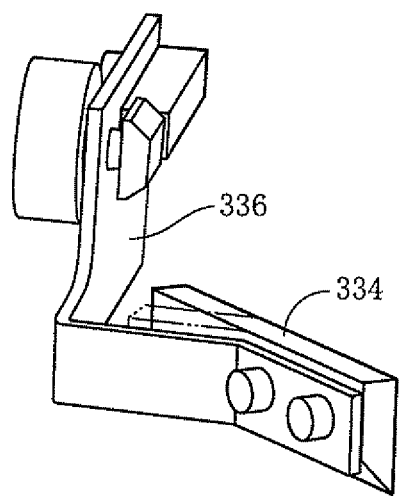
FIG. 10 is a perspective view showing a solder scraper device of the squeegee device.

Solder scraper members 334 are attached to the head holding member 292. Each of the solder scraper members 334 is attached to a corresponding one of brackets 336 shown in FIG. 10, and this bracket 336 is mounted on a back face of the head holding member 292. The solder scraper member 334 is formed of rubber and as shown in FIG. 10 takes a straight-bar posture having a trapezoid shape in cross section in its free state, but, in its attached state, the scraper member 334 is held in contact with a side end face of the squeegee 312 and elastically bent. As indicated by two-dot chain lines, this bent portion is parallel to a direction in which the squeegee 312 is moved. As described above, the change of the wedge angle of the squeegee 312 is made by the pivot of the squeegee 312 about the lower end edge of the squeegee 312 as a pivot center line. Thus, the change of the wedge angle does not change a vertical position of the lower end edge of the squeegee 312, and the solder scraper member 334 is always held in contact with the side end face of the squeegee 312 and the mask 132, so as to reliably scrape the solder to a squeegee-side.

Figure 11:
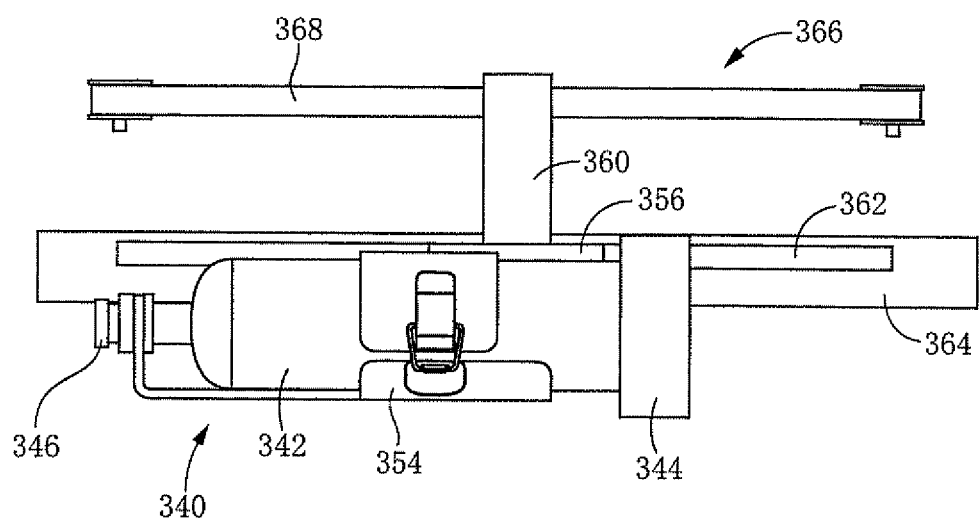
FIG. 11 is a front elevational view showing a solder supply device of the screen printing machine.
Figure 12:
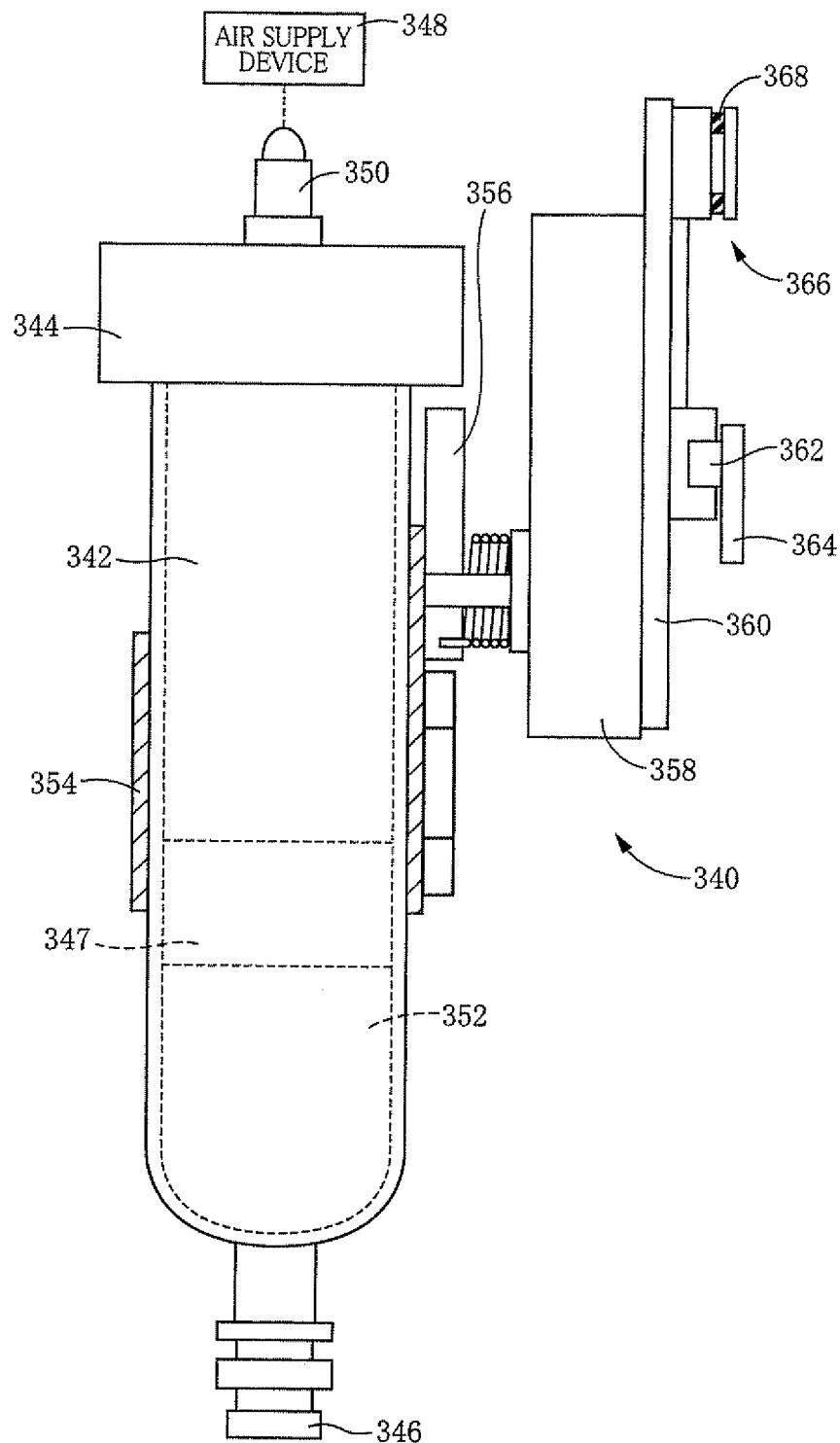
FIG. 12 is a partially cross-sectional side view showing the solder supply device.

The solder is supplied onto the mask 132 by a solder supply device 340 shown in FIGS. 11 and 12. The solder supply device 340 includes a solder container 342. The solder container 342 is an elongated member in the form of a cylindrical container and has an opening at its one end portion for replenishing the solder, but this opening is normally closed airtightly by a cap 344. The solder container 342 has an ejection opening 346 at the other end thereof. A piston 347 is slidably fitted in the solder container 342. A pressurized air is supplied from an air supply device 348 as an ejection drive device through an air supply portion 350 provided on the cap 344, whereby a solder 352 in the solder container 342 is pressurized via the piston 347 and thereby ejected from the ejection opening 346.

The solder container 342 is removably mounted on a pivot member 356 by a container holding device 354, and the pivot member 356 is mounted on a movable member 360 via a rotary cylinder 358 as a pivot-member drive device. The movable member 360 is held by a solder-supply-device main body 364 via a guide 362 so as to be movable in the right and left direction, and moved by a movable-member drive device 366. The movable-member drive device 366 includes a belt 368 rotated by an electric motor, not shown, as a drive source fixed to the solder-supply-device main body 364, and the movable member 360 is connected to a portion of this belt 368. Thus, the rotation of the electric motor moves the movable member 360 and the solder container 342 in the right and left direction. In the present embodiment, the solder-supply-device main body 364 is fixed in front of the squeegee slide 204 and moved together with the squeegee heads 230 but may be fixed to the squeegee-device main body 200 or the main body frame 70.

As shown in FIG. 11, the solder container 342 is normally in a lateral orientation in which a longitudinal direction thereof is parallel with the right and left direction. This is to prevent the solder 352 in the solder container 342 from dropping down from the ejection opening 346 by its own weight in no-air supply. In the supply of the solder 352, the solder container 342 is pivoted to a vertical orientation in which the ejection opening 346 faces downward. The solder container 342 in the lateral orientation cannot be moved through a sufficiently long stroke due to interference of surrounding components, but the solder container 342 in the vertical orientation can be moved in the right and left direction through a stroke corresponding to the largest solder-supply area on the mask 132. The solder 352 is supplied not onto a space between the pair of squeegees 312 but onto an outside of the space. The squeegee head 230 is then moved in a state in which one of the squeegees 312 is located at an upper position distant from the mask 132. The one squeegee 312 is then moved downward in a state in which the solder on the mask 132 is located between the pair of squeegees 312 in plan view. As a result, the solder is positioned at the space between the pair of squeegees 312.

In a state in which the solder container 342 stores full of the solder 352, and the solder container 342 is in the lateral orientation shown in FIG. 11, a considerably large rotation moment is applied to the pivot member 356 by the solder 352. In the present embodiment, however, the cap 344 is formed to have a relatively large mass, and as shown in FIG. 12 an elastic member in the form of a torsion coil spring 374 is provided between the pivot member 356 and a housing of the rotary cylinder 358. A rotation torque based on an elastic force of the torsion coil spring 374 and the weight of the cap 344 is applied to the solder container 342 by half a magnitude of a rotation torque based on the weight of full of the solder 352, in a direction opposite a direction in which the rotation torque based on the weight of the solder 352 is applied. The cap 344 and the torsion coil spring 374 constitute an opposite-moment apply device. As a result, a driving capability of the rotary cylinder 358 can be reduced by about a half, as compared with a case where the opposite-moment apply device is not provided.

Figure 13:
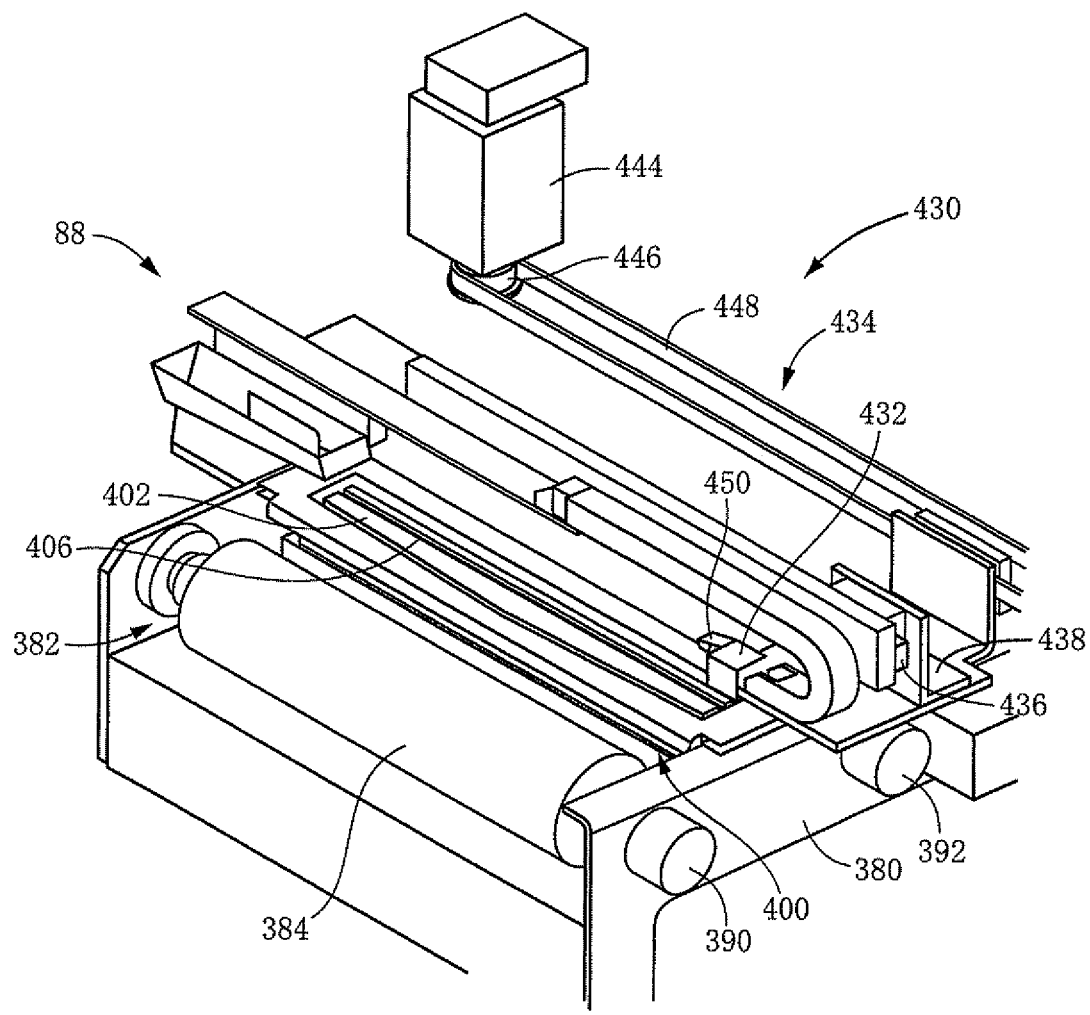
FIG. 13 is a perspective view showing a cleaning-liquid applying device of the screen printing machine.
Figure 14:
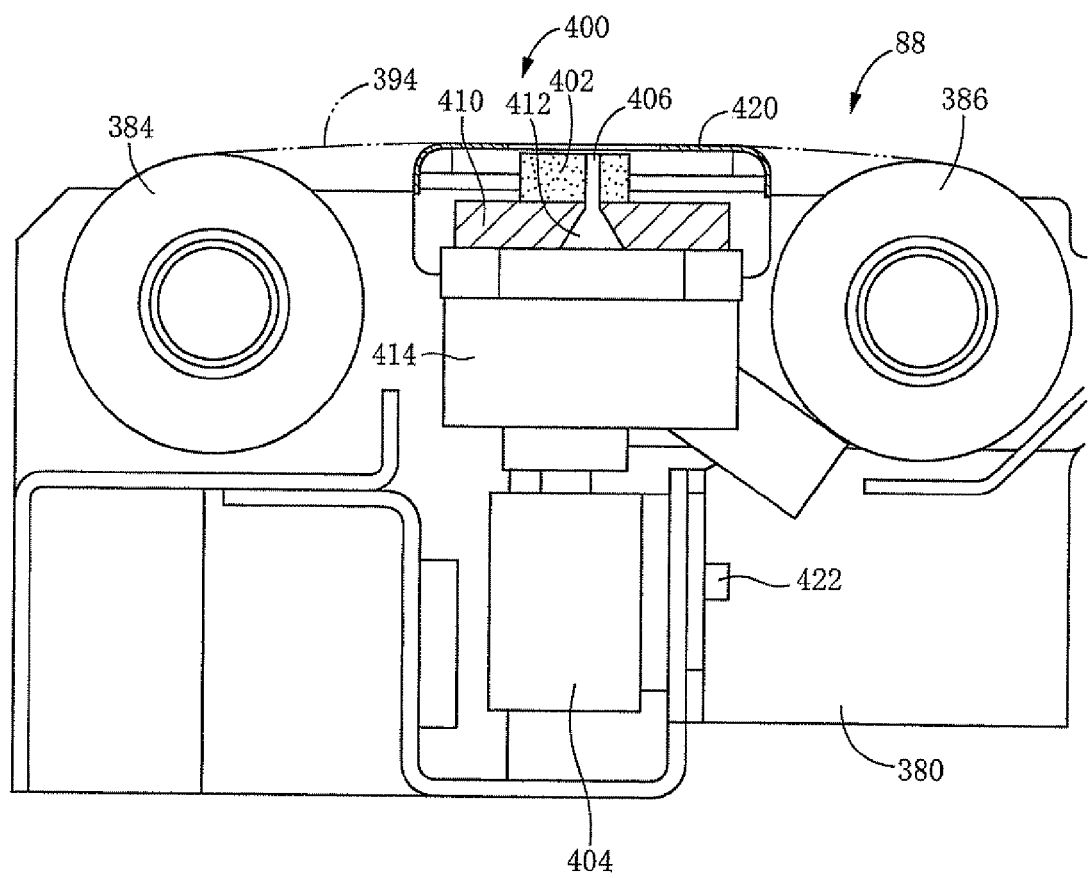
FIG. 14 is a side view showing the cleaning device of the screen printing machine, with the cleaning-device main body partially omitted.

FIGS. 13 and 14 show the mask cleaning device 88 in detail. A cleaning-device main body 380 is fixed to the slide 86 so as to serve as a part of the slide 86. Two roll holding devices 382 (noted that only one device is illustrated in FIG. 13) are held by the cleaning-device main body 380 so as to be spaced apart from each other in the front and rear direction. The roll holding devices 382 respectively holds: a first roll 384 on which an unused cleaning sheet is rolled; and a second roll 386 on which a used cleaning sheet is rolled, such that each of the first roll 384 and the second roll 386 is rotatable about its axis. The first and second rolls 384, 386 are respectively rotated by electric motors 390, 392 each as a roll drive device to convey a portion of the cleaning sheet which extends from the first roll 384 to the second roll 386 (hereinafter referred to as "spanning portion 394"). The first and second rolls 384, 386 can apply tension or slack in the spanning portion.

A sheet pressing device 400 is provided between the first and second rolls 384, 386. The sheet pressing device 400 includes: a pressing member 402 and an air cylinder 404 as a pressing-member drive device configured to move the pressing member 402 upward and downward. The pressing member 402 is constituted by a foamed material as an open-cell foam elongated in a direction parallel to the axes of the first and second rolls 384, 386. The pressing member 402 has a suction opening 406 expanding across an entire length of the pressing member 402. As shown in FIG. 14, the pressing member 402 is held by a holding member 410 that has an opening 412 having a length generally equal to that of the suction opening 406. The opening 412 has a transverse cross-sectional area increasing from its upper portion toward its lower portion, and a negative-pressure generating device 414 is connected to a lower end of the opening 412. Since the negative-pressure generating device 414 is constituted by a well-known device, detailed explanation and illustration thereof are omitted here, but the negative-pressure generating device 414 is for generating a negative pressure by utilizing a reduction in a pressure in surroundings of a nozzle for ejecting the pressurized air. The negative-pressure generating device 414 generates the negative pressure at central portions of the opening 412 and the suction opening 406 in their longitudinal direction. As a result, the air is sucked uniformly across the length of the suction opening 406 through the opening 412, the suction opening 406, and the spanning portion 394 together with cleaning liquid which will be described below and the solder left in the through holes 130 of the mask 132.

A sheet support member 420 for supporting the spanning portion 394 is fixed to the cleaning-device main body 380. The pressing member 402 is moved by the air cylinder 404 to one of a lower position at which the pressing member 402 is retracted to a lower side of the sheet support member 420 and an upper position at which the pressing member 402 projects upward from the sheet support member 420. Further, the air cylinder 404 is held by the cleaning-device main body 380 so as to be supported by a support shaft 422 such that the air cylinder 404 is rotatable about a rotation axis that is parallel to the front and rear direction. Thus, the pressing member 402 is pressed onto the mask 132 at a uniform pressure across an entire length of the pressing member 402, assuring that the spanning portion 394 is reliably held in close contact with a lower face of the mask 132.

The cleaning liquid is applied to the spanning portion 394 by a cleaning-liquid applying device 430 provided on a rear portion of the printer 10. The cleaning-liquid applying device 430 includes: a cleaning-liquid applying head 432; and an applying-head moving device 434 configured to move the cleaning-liquid applying head 432 in the direction parallel to the axes of the first and second rolls 384, 386. The cleaning-liquid applying device 430 is mounted on the main body frame 70 such that the cleaning-liquid applying head 432 is positioned on an upper side of the mask cleaning device 88 (strictly, the spanning portion 394 of the cleaning sheet) in a state in which the slide 86 is located at its retraction end position. The cleaning-liquid applying head 432 is held by a moving member 438 that is guided by a guide 436. The moving member 438 is moved by the applying-head moving device 434 including an electric motor 444, pulleys 446, and a belt 448, whereby the cleaning-liquid applying head 432 is moved within its moving range. Therefore, the cleaning-liquid applying head 432 applies the cleaning liquid only to a portion of the spanning portion 394 which is to clean the mask 132 actually. The cleaning liquid is mainly a solvent. The cleaning liquid is pressurized by a cleaning-liquid supply device, not shown, to be supplied to nozzles of the cleaning-liquid applying head 432 and ejected horizontally from the nozzles. The ejected cleaning liquid is received by a receiving member 450 provided opposite the nozzles, and dripped onto the spanning portion 394.

Figure 15A:
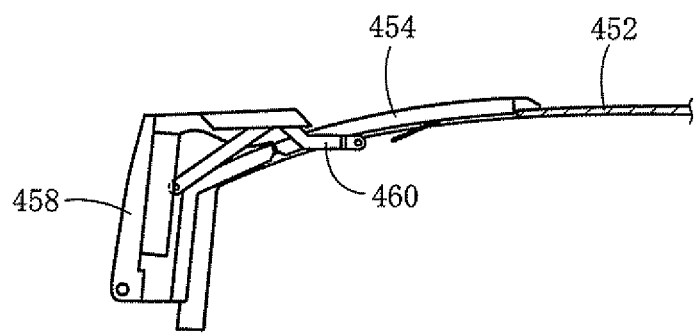
FIG. 15 is a side cross-sectional view partially showing a cover device of the screen printing machine.
Figure 15B:
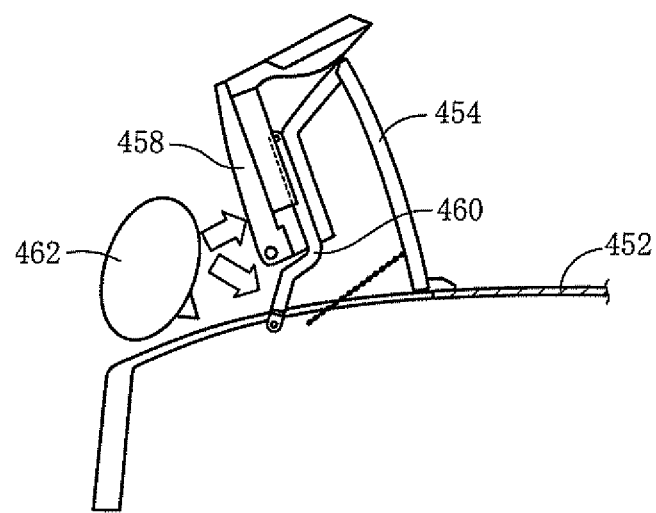

In the present printer 10, a printing portion including the front conveyor 22, the substrate holding device 110, the mask frame receiver 120, and the squeegee device 124 is provided on a front portion of the main body frame 70. An open/close door 454 is provided on a front portion of a cover 452 (see FIG. 1) for covering an entirety of the printer 10. The open/close door 454 is provided with an operation panel 458 including a display and a viewing window 456 through which an inside of the printer 10 can be seen. The open/close door 454 is easily opened by hand from a closed state shown in FIG. 15A to an open state shown in FIG. 15B. Further, the open/close door 454 can be stably kept at the state shown in FIG. 15B by a linkage mechanism constituted by the open/close door 454, a link 460, and the cover 452. The display of the operation panel 458 is mounted such that the display can be seen from a front side thereof also in the open state of the open/close door 454. Thus, an operator 462 can perform operations and monitoring required for driving the printer 10, from a front side of the printer 10. Further, the operator 462 can also perform maintenance and the like of the printing portion which require the open/close door 454 to be open, from a front side of the printer 10 while performing the operations to the operation panel 458 and the monitoring of the display. A cover device is constituted by the cover 452, the open/close door 454, and the viewing window 456.

As shown in FIG. 1, the electronic-circuit assembly line constructed as described above is controlled by a control system including: control devices 470 respectively for controlling the printers 10; control devices 472 respectively for controlling the mounting machines 14; and an overall control device 474 for controlling the control devices 470, 472. Each of the shuttle conveyors 12 is controlled by a corresponding one of the control devices 470 which is located upstream of the shuttle conveyor 12.

Figure 16:
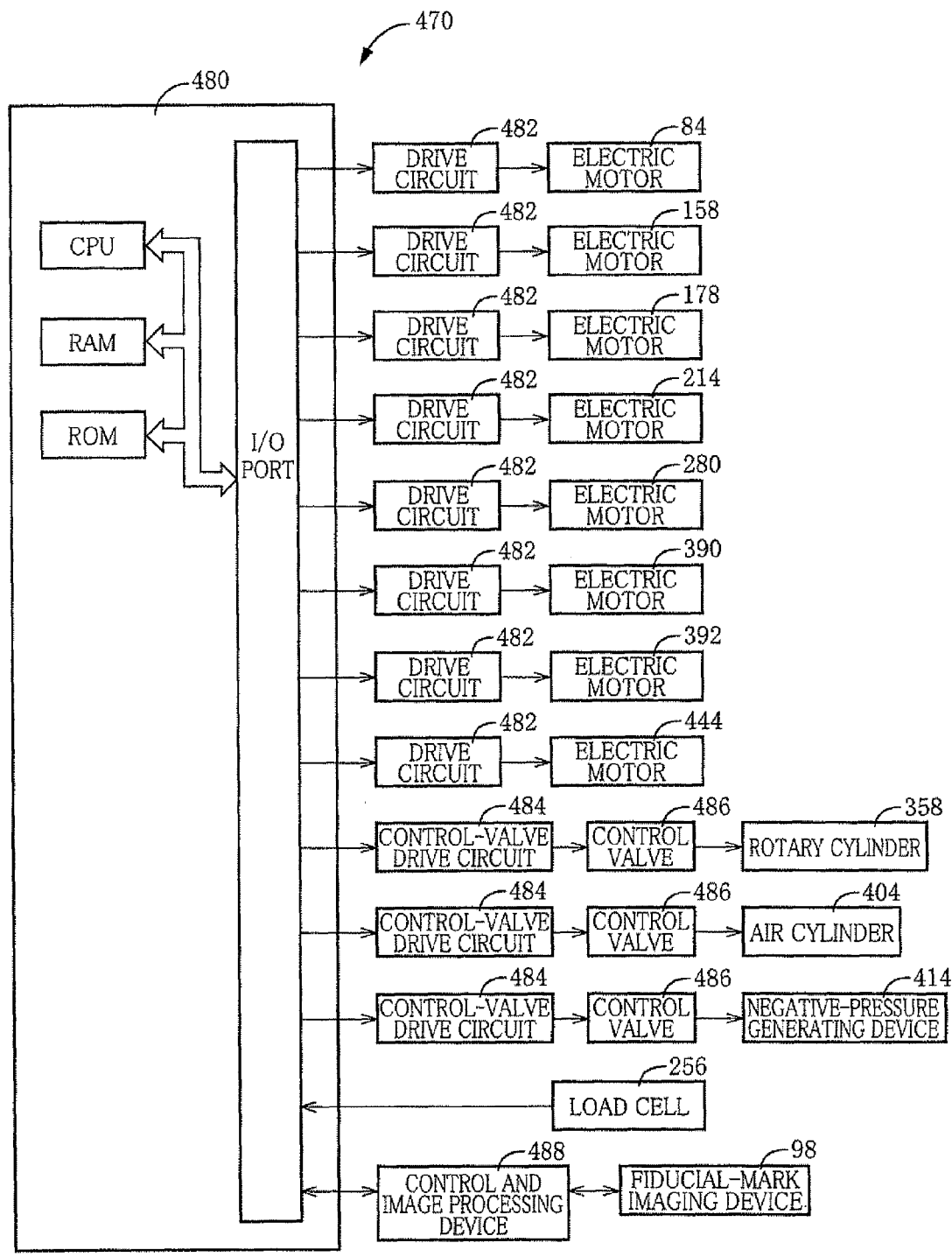
FIG. 16 is a block diagram showing a control device of the screen printing machine.

FIG. 16 shows a detailed configuration of each of the control devices 470. The control device 470 is mainly constituted by a computer 480 including a CPU, a RAM, a ROM, and an I/O port. Various detection devices and operating devices are connected to the computer 480. FIG. 16 shows some of these devices which closely relate to the claimable invention. Electric actuators such as the electric motors 84, 158, 178, 214, 280, 390, 392, 444 are connected to the I/O port respectively via drive circuits 482. Fluidic actuators such as the rotary cylinder 358, the air cylinder 404, and the negative-pressure generating device 414 are connected to the I/O port respectively via control-valve drive circuits 484 and control valves 486. The load cell 256 is directly connected to the I/O port, and the fiducial-mark imaging device 98 is connected to the I/O port via a control and image processing device 488.

The ROM of the computer 480 stores programs for controlling the operating devices based on information transmitted from the overall control device 474, the operation panel 458, and the various detection devices. There will be explained some of the operations of the printer 10 based on the controls, which some operations closely relate to the claimable invention.

(i) Position Adjustment between Circuit Substrate and Mask 132

After the circuit substrate is held by the substrate holding device 110 located at the lower position, the electric motor 84 and the electric motor, not shown, are operated to move the slides 86, 94. The fiducial-mark imaging device 98 then takes the images of the fiducial marks provided on the circuit substrate and the mask 132, and a positional error between the circuit substrate and the mask 132 is removed based on the taken images. The control of the position adjusting device 122 for the electric motors 158, 178 adjusts a position of the mask frame receiver 120 in the right and left direction and in the front and rear direction and a rotational position of the mask frame receiver 120, whereby the mask 132 is positioned at the position of the circuit substrate. After this positioning is finished, the mask cleaning device 88 and the fiducial-mark imaging device 98 are retracted from a space between the circuit substrate and the mask 132, and then the substrate holding device 110 is elevated, so that the circuit substrate is brought into close contact with the mask 132. In this state, the squeegee device 124 is operated, so that the solder is accurately printed on the circuit substrate.

(ii) Cleaning of Mask 132

When the print quality is deteriorated by contamination of the lower face of the mask 132 owing to a repetition of the printing or by remnants of the solder in the through holes 130, the mask cleaning device 88 is operated to clean the mask 132. In this operation, the mask cleaning device 88 is moved into a space between the substrate holding device 110 and the mask 132, and then the pressing member 402 is moved upward by the air cylinder 404, so that the spanning portion 394 of the cleaning sheet is pressed onto the lower face of the mask 132. In this state, the mask cleaning device 88 is moved linearly in the front and rear direction by a cleaning-device moving device mainly constituted by the electric motor 84, and, during this movement, the position adjusting device 122 is operated such that the mask 132 is moved in the right and left direction, reciprocated in the front and rear direction, and/or rotated about a vertical axis thereof. For example, when the mask 132 is moved around its axis and reciprocated in the right and left direction, the spanning portion 394 of the cleaning sheet is moved with respect to the mask along a curved path created by combination of the linear movement of the mask cleaning device 88, and the circular movement and the left and right reciprocation of the mask 132, whereby the mask 132 is cleaned effectively when compared with a movement along a simple linear path. A cleaning-related control section is constituted by a section of the control devices 470 which executes a relational control for controlling the cleaning-device moving device and the position adjusting device 122 to move the spanning portion 394 for a desired wiping operation.

(iii) Provision of Slack in Cleaning Sheet

As described above, slack is provided in the spanning portion 394 of the cleaning sheet when the mask 132 is cleaned. As described above, after the spanning portion 394 is pressed onto the mask 132, the pressing member 402 is slightly lowered, and one of the electric motors 390, 392 is rotated by a predetermined angle, whereby the spanning portion 394 is slackened a certain amount. The air is sucked from the suction opening 406 in this state, a part of the spanning portion 394 is drawn into the suction opening 406. That is, a recess extending along a longitudinal direction of the suction opening 406 is formed in a central part of a portion of the spanning portion 394, which portion is pressed onto the mask 132 by the pressing member 402. The pressing member 402 is then elevated again, so that the spanning portion 394 is pressed onto the lower face of the mask 132 to perform the cleaning. In the cleaning, the solder adhering to the mask 132 is wiped by the cleaning sheet or sucked toward the cleaning sheet together with an air, and a large part of the solder is delivered into the recess of the spanning portion 394. This makes it possible to avoid the solder adhering to the mask 132 again, enabling effective cleaning of the mask 132.

(iv) Maintenance of Mask Cleaning Device 88

The mask cleaning device 88 needs maintenances such as replacement of the cleaning sheet. These maintenances can be performed from a front side of the printer 10. Specifically, the position adjusting device 122 is configured such that the mask frame receiver 120 can be moved rearward a distance equal to or greater than a distance required for a position adjustment. Thus, when the mask frame receiver 120 is retracted to a retraction limit position, and the mask cleaning device 88 is advanced to an advancement limit position, the mask frame receiver 120, the mask frame 134, and the mask 132 do not interfere with access to the mask cleaning device 88. Further, since the cover 452 of the printer 10 is provided with the open/close door 454 as described above, the maintenances of the mask cleaning device 88 such as the replacement of the cleaning sheet can be easily performed from a front side of the printer 10.

(v) Adjustment of Pressing Load of Squeegee 312

As described above, the second elevating and lowering members 242 and the squeegee heads 230 held thereby are moved upward and downward with respect to the first elevating and lowering member 240 by the elevating and lowering drive devices 270 constituted by the electric motors 280, the feed screws 272, the nuts 274, and so on, whereby the squeegee 312 is pressed on the circuit substrate with the mask 132 being interposed therebetween. A pressing force of the squeegee 312 in this pressing, i.e., a reaction force applied to the squeegee 312 by the circuit substrate and the mask 132 is transmitted to the load cell 256 via the squeegee heads 230, the second elevating and lowering members 242, the elevating and lowering drive devices 270, the first elevating and lowering member 240, and the compression coil spring 254, and the load cell 256 measures a magnitude of the transmitted pressing force. Since the compression coil spring 254 is provided in a transmission path of the reaction force, an amount of change of the reaction force with respect to a unit rotation angle of the electric motor 280 is small. Thus, the control of the rotation angle (a rotational position) of the electric motor 280 allows an easy and precise control of the pressing force of the squeegee 312 on the mask 132 and the circuit substrate.

(vi) Detection of Tension of Mask 132

The mask 132 is fixed (secured) to the mask frame 134 with an appropriate tension being applied to the mask 132. The tension lowers with use, which lowers a printing accuracy. Thus, in a conventional technique, the lowering of the tension is monitored, and if the tension becomes equal to or lower than a predetermined tension, the mask 132 and the mask frame 134 are replaced with new ones. In the present printer 10, a degree of the tension is detected using the load cell 256 and the electric motors 280. Specifically, the electric motors 280 are operated in the state in which the circuit substrate is distant from the mask 132, to press the squeegee 312 onto the mask 132. Then, a relationship between change of the rotation angle of the electric motor 280 and change of the load detected by the load cell 256 is obtained, whereby the degree of the tension of the mask 132 is detected. In the present embodiment, a section of the control devices 470 which detects a relationship of the degree of the tension of the mask 132 constitutes a tension-corresponding-amount obtaining section configured to obtain a tension corresponding amount that corresponds to the tension of the mask 132 one to one (e.g., a ratio obtained by dividing an amount of the change of the load detected by the load cell 256 by an amount of the change of the rotation angle of the electric motor 280).

(vii) Releasing Control of Squeegee 312 from Solder Roll

The electric motors 280 can be controlled to control a release of the squeegee 312 from a solder roll or rolls. The solder placed on the mask 132 is pressed by the squeegee 312 so as to be rolled in a roll-like shape. Thus, the solder is referred to as "solder roll". The squeegee 312 is spaced apart from the solder roll each time when one printing is finished. In this operation, a part of the solder adheres to the squeegee 312 and is drawn from the solder roll. If a speed of the release of the squeegee 312 (and a path of the release of the squeegee 312) is not appropriate, the shape of the solder roll is distorted, or air bubbles are trapped in the solder roll, leading to the deterioration of the print quality. In order to solve this problem, in the present printer 10, the rotational speed of the electric motor 280 is changed according to a predetermined pattern when the squeegee 312 is released, thereby preventing the solder from being inappropriately drawn from the solder roll. Where a magnitude of a downward force applied to the squeegee 312 is detected by the load cell 256, and the electric motors 280 are controlled also based on a result of this detection, the inappropriate drawing of the solder can be prevented more effectively. Further, where, in addition to or instead of this operation, the release of the squeegee 312 from the mask 132 and the movement of the squeegee 312 parallel to the mask 132 are combined with each other to make appropriate the path of the release of the squeegee 312 from the mask 132, the inappropriate drawing of the solder can be prevented effectively. A squeegee-release control section is constituted by a section of the control devices 470 which controls the elevating and lowering drive devices 270 (directly speaking, the electric motors 280) or controls the squeegee-slide driving device (directly speaking, the electric motor 214) as required to control the release of the squeegee 312 from the solder (the solder roll).

It will be understood from the foregoing explanation that, in the present embodiment, the guides 202, the squeegee slide 204, the squeegee-slide driving device 206 constitute the squeegee moving device, and the guides 80, the feed screw 82, the electric motor 84, and the slide 86 constitute the cleaning-device moving device. Further, the right and left direction and the front and rear direction are respectively a first direction and a second direction which intersect each other in a plane in which the position adjusting device 122 performs the position adjustment. Two pairs of the electric motors 158 and the feed screws 156 constitute two first drive devices capable of driving the slides 160 as two first slides in the second direction independently of each other, and the electric motor 178 and the feed screw 176 constitute a second drive device capable of driving the slide 180 as a third slide in the first direction. A section of the control devices 470 which executes a relational control between the electric motors 158, 178 constitutes an adjustment control device configured to adjust a first position and a second position of the mask frame receiver in two directions intersecting each other and a rotational position of the mask frame receiver about its vertical axis. Further, a construction in which the air cylinder 404 as the pressing-member drive device is supported pivotably about an axis of the support shaft 422 constitutes a pivot allowing device configured to allow the pressing member to pivot about a pivot axis that is parallel to the lower face of the mask.

EXPLANATION OF REFERENCE NUMERALS

10: printer (screen printing machine), 12: shuttle conveyor, 14: mounting machine (electronic-circuit-component mounting machine), 20: printer main body, 22: front conveyor, 24: rear conveyor, 26: main conveyor, 28: in-conveyor, 30: out-conveyor, 70: main body frame, 80: guide, 82: feed screw, 84: electric motor, 86: slide, 88: mask cleaning device, 120: mask frame receiver, 122: position adjusting device, 124: squeegee device, 132: mask, 134: mask frame, 144: front/rear-direction adjusting unit, 146: right/left-direction adjusting unit, 148: floating support unit, 154, 174: guide, 156, 176: feed screw, 158, 178: electric motor, 160, 152, 180, 182: slide, 164, 184: rotational member, 200: squeegee-device main body, 202: guide, 204: squeegee slide, 206: squeegee-slide driving device, 240: first elevating and lowering member, 242: second elevating and lowering member, 244: guide rod, 246, 248: guide sleeve, 254: compression coil spring, 256: load cell, 262: extension coil spring, 270: elevating and lowering drive device, 272: feed screw, 274: nut, 280: electric motor

The invention claimed is:

1. A screen printing machine configured to print solder cream on a circuit substrate through a through hole of a mask, the screen printing machine comprising:
   a main body frame;
   a mask frame configured to hold the mask;
   a mask frame receiver held by the main body frame and configured to move relative to the main body frame in a parallel direction that is parallel to the mask, the mask frame receiver being configured to receive the mask frame;
   a squeegee moving device configured to move together with the mask frame receiver while the mask frame receiver is moving relative to the main body frame in the parallel direction, the squeegee moving device being configured to move a squeegee;
   a substrate support device configured to support the circuit substrate, the substrate support device being unmovable relative to the main body frame at least in the parallel direction that is parallel to the mask; and
   a position adjusting device configured to adjust a position of the mask frame receiver relative to the main body frame in the parallel direction, the position adjusting device being provided between the mask frame receiver and the main body frame,
   wherein:
      the position adjusting device is configured to adjust a first position and a second position of the mask frame receiver respectively in a first direction and a second direction which intersect each other in an adjustment plane parallel to the parallel direction, the position adjusting device being configured to adjust a rotational position of the mask frame receiver about a rotation axis perpendicular to the adjustment plane, and
      the position adjusting device includes:
         two first slides provided at respective two positions spaced apart from each other in the first direction such that positions of the first two slides in the second direction are adjustable,
         two second slides held by the two first slides, respectively, so as to be movable relative to the respective first slides in the first direction,
         two first rotational members fixed to the mask frame receiver and held by the two second slides, respectively, such that each of two first rotational members is rotatable relative to a corresponding one of the two second slides about a rotation axis perpendicular to the adjustment plane,
         a third slide provided at a position spaced apart from the two first slides in the second direction such that a position of the third slide in the first direction is adjustable,
         a fourth slide held by the third slide so as to be movable relative to the third slide in the second direction, and
         a second rotational member fixed to the mask frame receiver and held by the fourth slide so as to be rotatable relative to the fourth slide and about a rotation axis perpendicular to the adjustment plane.

2. The screen printing machine according to claim 1, wherein the position adjusting device further comprises:
   two first drive devices capable of driving the two first slides in the second direction independently of each other;
   a second drive device capable of driving the third slide in the first direction; and
   an adjustment control device configured to execute a relational control of the two first drive devices and the second drive device to adjust the first position, the second position, and the rotational position of the mask frame receiver.

3. The screen printing machine according to claim 1, further comprising:
   an elevating and lowering device configured to elevate and lower the substrate support device in a direction perpendicular to the mask;
   a mask cleaning device held by the main body frame so as to be allowed to enter into a space between the mask frame receiver and the substrate support device by the lowering of the substrate support device by the elevating and lowering device, the mask cleaning device being configured to clean the mask;
   a cleaning-device moving device configured to move the mask cleaning device in a cleaning-device movement direction that is parallel to the mask received by the mask frame receiver; and
   a cleaning-related control section configured to execute a relational control for controlling the cleaning-device moving device and the position adjusting device to set a relative moving path of the mask cleaning device and the mask received by the mask frame, as a curve.

4. The screen printing machine according to claim 1, further comprising:
   an elevating and lowering device configured to elevate and lower the substrate support device in a direction perpendicular to the mask;
   a mask cleaning device held by the main body frame so as to be allowed to enter into a space between the substrate support device and the mask frame receiver by the lowering of the substrate support device by the elevating and lowering device, the mask cleaning device being configured to clean the mask; and
   a cleaning-device moving device configured to move the mask cleaning device in a cleaning-device movement direction that is parallel to the mask received by the mask frame receiver,
   wherein a maximum distance in which the position adjusting device is capable of moving the mask frame receiver in a direction parallel to the cleaning-device movement direction is made greater than a maximum distance in which the position adjusting device needs to move the mask frame receiver to adjust relative positions between the mask and the circuit substrate, thereby to establish a state in which the mask received by the mask frame receiver does not interfere with access to the mask cleaning device in a state in which the mask cleaning device is moved to a moving end position near a front portion of the screen printing machine, and
   wherein the screen printing machine further comprises a cover device configured to cover an inner space of the screen printing machine, and the cover device includes an open/close door movable selectively to one of: an open position at which the open/close door opens a portion of the inner space near the front portion of the screen printing machine in at least one of a frontward direction and an upward direction; and a closing position at which the open/close door closes the portion of the inner space near the front portion.

5. The screen printing machine according to claim 1, wherein the mask frame receiver and the squeegee moving device are provided on a front portion of the screen printing machine, wherein the screen printing machine further comprises a cover device configured to cover an inner space of the screen printing machine, and the cover device includes an open/close door movable selectively to one of: an open position at which the open/close door opens a portion of the inner space near the front portion of the screen printing machine in at least one of a frontward direction and an upward direction; and a closing position at which the open/close door closes the portion of the inner space near the front portion, and wherein the mask frame receiver and the squeegee moving device are provided at positions accessible from a front of the screen printing machine in a state in which the open/close door is located at the open position.

* * * * *

UNITED STATES PATENT AND TRADEMARK OFFICE
CERTIFICATE OF CORRECTION

| | |
|---|---|
| PATENT NO. | : 9,073,301 B2 |
| APPLICATION NO. | : 13/643554 |
| DATED | : July 7, 2015 |
| INVENTOR(S) | : Kondo et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 175 days.

Signed and Sealed this
Nineteenth Day of April, 2016

Michelle K. Lee
*Director of the United States Patent and Trademark Office*